(12) United States Patent
Priewasser

(10) Patent No.: US 12,062,533 B2
(45) Date of Patent: Aug. 13, 2024

(54) METHOD OF PRODUCING A SUBSTRATE AND SYSTEM FOR PRODUCING A SUBSTRATE

(71) Applicant: DISCO Corporation, Tokyo (JP)

(72) Inventor: Karl Heinz Priewasser, Munich (DE)

(73) Assignee: DISCO CORPORATION, Tokyo (JP)

( * ) Notice: Subject to any disclaimer, the term of this patent is extended or adjusted under 35 U.S.C. 154(b) by 490 days.

(21) Appl. No.: 17/314,844

(22) Filed: May 7, 2021

(65) Prior Publication Data

US 2021/0358736 A1 Nov. 18, 2021

(30) Foreign Application Priority Data

May 18, 2020 (DE) ............ 10 2020 206 233.1

(51) Int. Cl.
*H01L 21/02* (2006.01)
*B23K 26/53* (2014.01)
*B28D 5/00* (2006.01)
*H01L 21/683* (2006.01)
*B23K 101/40* (2006.01)

(52) U.S. Cl.
CPC ........ *H01L 21/02013* (2013.01); *B23K 26/53* (2015.10); *B28D 5/0011* (2013.01); *H01L 21/02019* (2013.01); *H01L 21/6835* (2013.01); *B23K 2101/40* (2018.08); *H01L 2221/68318* (2013.01)

(58) Field of Classification Search
CPC ........... H01L 21/02013; H01L 21/6835; H01L 21/02019; H01L 2221/68318; B23K 26/53
See application file for complete search history.

(56) References Cited

U.S. PATENT DOCUMENTS

| | | | |
|---|---|---|---|
| 10,576,585 B1 * | 3/2020 | Donofrio | ......... H01L 21/67115 |
| 2013/0252356 A1 * | 9/2013 | Ezaki | ................ H01L 21/6835 |
| | | | 438/18 |

(Continued)

FOREIGN PATENT DOCUMENTS

| CN | 108372434 A | 8/2018 |
|---|---|---|
| JP | 2002208708 A | 7/2002 |

(Continued)

*Primary Examiner* — Binh X Tran
(74) *Attorney, Agent, or Firm* — GREBR BURNS & CRAIN, LTD.

(57) ABSTRACT

The invention relates to a method of producing a substrate. The method comprises providing a workpiece having a first surface and a second surface opposite the first surface, and providing a carrier having a first surface and a second surface opposite the first surface. The method further comprises attaching the carrier to the workpiece, wherein at least a peripheral portion of the first surface of the carrier is attached to the first surface of the workpiece, and forming a modified layer inside the workpiece. Moreover, the method comprises dividing the workpiece along the modified layer, thereby obtaining the substrate, wherein the substrate has the carrier attached thereto, and removing carrier material from the side of the second surface of the carrier in a central portion of the carrier so as to form a recess in the carrier. The invention further relates to a substrate producing system for performing this method.

11 Claims, 5 Drawing Sheets

(56) References Cited

U.S. PATENT DOCUMENTS

| | | | |
|---|---|---|---|
| 2015/0287687 A1* | 10/2015 | Farrens | ............... H01L 21/2855 257/737 |
| 2015/0332928 A1 | 11/2015 | Priewasser | |
| 2020/0075414 A1 | 3/2020 | Sekiya | |

FOREIGN PATENT DOCUMENTS

| | | | |
|---|---|---|---|
| JP | 2003282845 | A | 10/2003 |
| JP | 2005294623 | A | 10/2005 |
| JP | 2010188385 | A | 9/2010 |
| JP | 2012009516 | A | 1/2012 |
| JP | 2013197511 | A | 9/2013 |
| JP | 2017034254 | A | 2/2017 |
| JP | 2019077018 | A | 5/2019 |
| TW | 201117901 | A | 6/2011 |
| TW | 201933438 | A | 8/2019 |
| TW | 201942426 | A | 11/2019 |

* cited by examiner

METHOD OF PRODUCING A SUBSTRATE AND SYSTEM FOR PRODUCING A SUBSTRATE

TECHNICAL FIELD

The present invention relates to a method of producing a substrate, such as a wafer, from a workpiece, such as an ingot or a thicker substrate. Further, the present invention relates to a system for performing this method.

TECHNICAL BACKGROUND

On substrates, such as wafers, e.g., semiconductor wafers, devices, such as integrated circuits (ICs), large scale integrations (LSIs) and light emitting diodes (LEDs), are formed by providing a device layer on a front surface of the substrate. The substrate may be a wafer, for example, made of silicon carbide (SiC), gallium nitride (GaN), gallium arsenide (GaAs) or the like. The devices may be, e.g., semiconductor devices, for example, for power semiconductors designed for power saving products.

For instance, in an optical device fabrication process, an optical device layer, e.g., composed of an n-type nitride semiconductor layer and a p-type nitride semiconductor layer, is formed on the front side of a single crystal substrate, such as a silicon carbide substrate, a gallium nitride substrate or a sapphire substrate. The optical device layer is partitioned by crossing division lines (also referred to as "streets") to define separate regions where optical devices, such as light emitting diodes and laser diodes, are respectively formed. By providing the optical device layer on the front side of the single crystal substrate, an optical device wafer is formed. The optical device wafer is separated, e.g., cut, along the division lines to divide the separate regions where the optical devices are formed, thereby obtaining the individual optical devices as chips or dies.

The substrate, such as a wafer, is obtained by cutting a workpiece, such as an ingot. Conventionally, the workpiece is cut, for example, by using a wire saw.

However, in such conventional methods, a significant amount of workpiece material is lost in the process of producing the substrate. For example, if a SiC wafer is obtained by slicing a SIC ingot, e.g., with a wire saw, the wafer thickness is typically about 400 μm. After cutting off the wafer from the ingot, the wafer is ground and/or polished to a thickness of approximately 350 μm. Subsequently, a device layer is formed on a front surface of the wafer. The desired final thickness of the wafer with the device layer is about 200 μm or less. The problem of workpiece material loss in the substrate producing process is particularly pronounced for expensive workpiece materials, such as SiC.

US 2020/0075414 A1 discloses a SiC substrate processing method for producing a SiC substrate from a SiC ingot. The method taught in this document includes a separation layer forming step of setting a focal point of a laser beam having a transmission wavelength to SiC inside the SiC ingot at a predetermined depth from the upper surface of the SiC ingot and next applying the laser beam to the SiC ingot to thereby form a separation layer for separating the SiC substrate from the SiC ingot. Further, the method comprises a substrate attaching step of attaching a substrate to the upper surface of the SiC ingot and a separating step of applying an external force to the separation layer to thereby separate the SiC substrate with the substrate from the SiC ingot along the separation layer.

There remains a need for an efficient method of producing a substrate and an efficient substrate producing system which facilitate handling of the substrate and allow for the number of substrates to be obtained from a workpiece to be increased.

SUMMARY OF THE INVENTION

Accordingly, it is an object of the present invention to provide an efficient method of producing a substrate which facilitates handling of the substrate and allows for the number of substrates to be obtained from a workpiece to be increased. Further, the invention aims to offer a substrate producing system for performing this method. These goals are achieved by a substrate producing method with the technical features of claim 1 and by a substrate producing system with the technical features as described herein. Preferred embodiments of the invention follow from the dependent claims.

The invention provides a method of producing a substrate. The method comprises providing a workpiece having a first surface and a second surface opposite the first surface, and providing a carrier having a first surface and a second surface opposite the first surface. The method further comprises attaching the carrier to the workpiece, wherein at least a peripheral portion of the first surface of the carrier is attached to the first surface of the workpiece, and forming a modified layer inside the workpiece. Moreover, the method comprises dividing the workpiece along the modified layer, thereby obtaining the substrate, wherein the substrate has the carrier attached thereto, and removing carrier material from the side of the second surface of the carrier in a central portion of the carrier so as to form a recess in the carrier.

In the method of the invention, the modified layer is formed inside the workpiece. In the modified layer, the workpiece has been modified, at least in some regions thereof, e.g., by the application of an external stimulus, such as radiation, for example, by using a laser beam. The modified layer may consist of or comprise regions of the workpiece in which the structure of the workpiece material has been modified. These regions may be regions of the workpiece in which the workpiece has been damaged.

The modified layer formed inside the workpiece may consist of or comprise a plurality of modified regions. The modified regions are regions of the workpiece which have been modified, e.g., by the application of an external stimulus, such as radiation, for example, by using a laser beam. The modified regions may be regions of the workpiece in which the structure of the workpiece material has been modified. The modified regions may be regions of the workpiece in which the workpiece has been damaged.

By forming the modified layer inside the workpiece, the strength of the workpiece in the area thereof where the modified layer is formed is reduced. Thus, the strength of the workpiece in the area where the modified layer is formed is smaller than in those areas thereof in which no modified layer or modified regions are formed. Hence, the modified layer serves as a separation or division starting layer, facilitating the process of dividing the workpiece.

After forming the modified layer inside the workpiece, the workpiece is divided along the modified layer, thereby obtaining the substrate having the carrier attached thereto. No cutting of the workpiece is required to obtain the substrate. Hence, the number of substrates which can be obtained from a workpiece is increased while material losses are reduced. For example, dividing the workpiece along the modified layer may comprise or consist of applying an external stimulus to the workpiece.

The workpiece has a thickness in the direction from the first surface of the workpiece towards the second surface of the workpiece. The carrier has a thickness in the direction from the first surface of the carrier towards the second surface of the carrier. The arrangement of the modified layer inside the workpiece determines the thickness and the thickness uniformity of the substrate to be obtained from the workpiece.

The carrier greatly facilitates the separation of the substrate from the remainder of the workpiece and the handling of the substrate, e.g., in further substrate processing steps. Substrates with a reduced thickness and a high degree of thickness uniformity can be efficiently obtained and safely handled, thus allowing for the number of substrates obtainable from the workpiece to be increased even more while material losses are further reduced. In particular, e.g., for silicon carbide (SiC) workpieces, a total thickness variation (TTV) of the substrate of 1 μm or less and a thickness variation between different substrates of less than 1 μm can be achieved. The high degree of substrate thickness uniformity achievable by the method of the present invention further allows for substrates with excellent electrical characteristics to be provided.

The carrier having the recess formed therein enables especially efficient and reliable handling of the substrate attached thereto. In particular, the recess facilitates access to the surface of the substrate on a side of the substrate at which the carrier is attached, e.g., for testing and/or further processing the substrate, while the substrate is securely held by the carrier. The portion of the carrier around the recess, such as a peripheral carrier portion, acts as a reinforcement and support to the substrate, in particular, during handling and further processing thereof. Hence, even very thin substrates can be safely handled and processed. The method of the present invention thus allows for final substrate thicknesses to be efficiently and reliably achieved which are considerably below the conventional final thicknesses of about 350 μm to 400 μm.

Therefore, the present invention provides an efficient method of producing a substrate which facilitates handling of the substrate and allows for the number of substrates to be obtained from a workpiece to be increased.

The workpiece may be, for example, an ingot, such as a semiconductor ingot, or a substrate, i.e., a thicker substrate from which a thinner substrate is to be obtained, such as a semiconductor substrate. The workpiece, such as an ingot or a thicker substrate, may have a thickness of 0.5 mm or more, a thickness of 1 mm or more or a thickness of 2 mm or more. In particular, the workpiece may have a thickness in the range of 0.5 mm to 50 mm. However, the workpiece also may have a thickness of more than 50 mm. The workpiece may have a substantially cylindrical shape. For example, the workpiece may have a diameter of 2 inches, 3 inches, 4 inches, 6 inches or 8 inches.

The first and second surfaces of the workpiece may be substantially parallel to each other.

The workpiece may be, for example, made of a semiconductor, glass, sapphire ($Al_2O_3$), a ceramic, such as an alumina ceramic, quartz, zirconia, PZT (lead zirconate titanate), a polycarbonate, an optical crystal material or the like.

In particular, the workpiece may be, for example, made of silicon carbide (SiC), silicon (Si), gallium arsenide (GaAs), gallium nitride (GaN), gallium phosphide (GaP), indium arsenide (InAs), indium phosphide (InP), silicon nitride (SiN), lithium tantalate (LT), lithium niobate (LN), aluminium nitride (AlN), silicon oxide ($SiO_2$) or the like. Particularly preferably, the workpiece is made of SiC.

The workpiece may be a single crystal workpiece, a glass workpiece, a compound workpiece, such as a compound semiconductor workpiece, e.g., a SiC, GaN or GaAs workpiece, or a polycrystalline workpiece, such as a ceramic workpiece.

The substrate to be obtained from the workpiece may be made of any of the materials given above. For example, the substrate may be a wafer, such as a semiconductor wafer. The semiconductor wafer may be made of any of the semiconductor materials given above, in particular, SiC.

The surface of the substrate on the side of the substrate at which the carrier is attached is a first surface of the substrate. The first surface of the substrate is the same as the first surface of the workpiece. The substrate further has a second surface opposite the first surface. The substrate has a thickness in the direction from the first surface of the substrate towards the second surface of the substrate. The substrate may have a thickness in the range of 1 μm to 500 μm, preferably 1 μm to 250 μm and more preferably 1 μm to 70 μm.

The first and second surfaces of the substrate may be substantially parallel to each other.

The carrier may be made of a rigid or hard material, such as Si and/or glass and/or a ceramic and/or stainless steel (SUS). The carrier may be made of one or more of the materials given above for the workpiece.

Particularly preferably, the carrier is made of Si. In this case, an especially cost-efficient carrier can be provided. Further, since Si is easy to process, the step of removing carrier material can be performed in a particularly efficient and simple manner.

The carrier may be a substrate, in particular, a rigid or hard substrate. For example, the carrier may be a wafer, e.g., a semiconductor wafer, in particular, a Si wafer. The dimensions of semiconductor wafers are defined in the SEMI standards. If a semiconductor wafer is used as the carrier, standard semiconductor equipment can be particularly efficiently and easily used for processing and/or handling the substrate attached to the carrier.

The carrier may have a thickness in the range of 400 μm to 1200 μm, preferably 500 μm to 1000 μm. The carrier may have a substantially cylindrical shape. The carrier may have substantially the same diameter as the workpiece. The diameter of the carrier may be smaller or larger than the diameter of the workpiece. For example, the carrier may have a diameter of 2 inches, 3 inches, 4 inches, 6 inches or 8 inches.

If the carrier has substantially the same diameter as the workpiece, existing equipment, such as standard semiconductor equipment, can be particularly efficiently and easily used, e.g., without the need for considerable modifications to the equipment. Hence, the method of the invention can be performed in a particularly cost-efficient manner.

The first and second surfaces of the carrier may be substantially parallel to each other.

The modified layer may be formed inside the workpiece from the side of the first surface of the workpiece. Forming the modified layer inside the workpiece from the side of the first surface of the workpiece allows for the modified layer to be formed in a particularly well-defined manner and with a particularly high degree of accuracy. This applies, in particular, if the thickness of the substrate to be obtained, e.g., 1 μm to 70 μm, is considerably smaller than the thickness of the workpiece, e.g., 1 mm or more. For example, the thickness of the substrate to be obtained may be smaller than the thickness of the workpiece by a factor of 3 or more, a factor of 5 or more, a factor of 8 or more, a factor of 10 or more, a factor of 15 or more or a factor of 20 or more. In this case, forming the modified layer inside the workpiece from the side of the first surface of the workpiece requires a significantly smaller penetration depth in the workpiece than forming the modified layer inside the workpiece from the side of the second surface of the workpiece. Hence, the modified layer can be formed particularly accurately, allowing for the thickness of the substrate to be obtained to be further reduced.

Alternatively, the modified layer may be formed inside the workpiece from the side of the second surface of the workpiece. This approach may be adopted, in particular, if the workpiece has a relatively small thickness, e.g., less than 2 mm.

The modified layer may be formed inside the workpiece before attaching the carrier to the workpiece. In this case, the modified layer can be formed in a particularly efficient and well-defined manner, especially if the modified layer is formed from the side of the first surface of the workpiece.

The modified layer may be formed inside the workpiece after attaching the carrier to the workpiece. In this case, the modified layer may be formed from the side of the first surface of the workpiece through the carrier, e.g., by using an external stimulus, such as radiation, e.g., laser radiation, which is transmitted through the carrier.

The method of the invention may further comprise exposing a portion of the surface of the substrate on the side of the substrate at which the carrier is attached, i.e., a portion of the first surface of the substrate.

A portion of the surface of the substrate, on the side of the substrate at which the carrier is attached, may be exposed in the step of removing carrier material.

For example, carrier material may be removed from the side of the second surface of the carrier in the central portion of the carrier so as to form a recess in the carrier which extends through the entire thickness of the carrier. In this case, the recess is open to the first and second surfaces of the carrier. Thus, the portion of the first surface of the substrate is exposed through the recess.

The recess formed in the central portion of the carrier may be surrounded by a peripheral portion of the carrier. The peripheral portion of the carrier may have a substantially annular shape or an annular shape. The peripheral portion of the carrier may have a ring width of 1 mm to 3 mm. The ring width is defined as half the difference of the outer diameter of the peripheral portion of the carrier and the inner diameter of the peripheral portion of the carrier.

The peripheral portion of the carrier, in particular, an annular or substantially annular peripheral carrier portion, acts as an especially reliable and robust reinforcement and support to the substrate, e.g., during handling and further processing thereof. This can allow for the final substrate thickness to be reduced even further.

The surface of the substrate on the side of the substrate at which the carrier is attached, i.e., the first surface of the substrate, may be exposed in the entire area in which the recess is formed in the carrier. For example, the first surface of the substrate may be exposed in the entire central portion of the carrier. In this case, the first surface of the substrate is particularly efficiently and easily accessible, e.g., for testing and/or processing the substrate, while the substrate is securely held by the carrier.

Alternatively, the surface of the substrate on the side of the substrate at which the carrier is attached may be exposed only in a part of the area in which the recess is formed in the carrier, e.g., by lithography. For example, carrier material may be maintained, e.g., in a grid arrangement, in areas of the substrate along which the substrate is to be subsequently divided, e.g., cut. In this way, the process of dividing the substrate can be considerably facilitated.

The method of the invention may further comprise processing the exposed portion of the surface of the substrate on the side of the substrate at which the carrier is attached, i.e., the exposed portion of the first surface of the substrate. The exposed portion of the first surface of the substrate can be processed in a state in which the substrate is attached to the carrier. Thus, even very thin substrates can be efficiently and safely handled during processing. The substrate can be processed through the exposed portion of the first surface of the substrate. The substrate can be processed from the side of the first surface of the substrate.

For example, the exposed portion of the first surface of the substrate may be subjected to a metallization process. In such a process, a metal layer or metal coating is deposited on the exposed portion of the first surface of the substrate.

Further examples of processing the exposed portion of the first surface of the substrate are lithography processes and/or the forming, e.g., drilling, of via holes or through holes from the side of the first substrate surface. Alternatively or in addition, ablation laser processing and/or stealth laser processing may be performed at the exposed portion of the first substrate surface. These processes may be carried out as an alternative or in addition to the metallization process described above.

The method of the invention may further comprise performing a testing process, in particular, an electrical testing process, on the exposed portion of the first surface of the substrate. The testing process can be performed on the exposed portion of the first substrate surface in a state in which the substrate is attached to the carrier. Thus, even very thin substrates can be efficiently and safely handled during testing, in particular, electrical testing. Further, the testing process can be carried out in an especially reliable manner since any deformation, such as warpage, of the substrate can be avoided due to the support by the carrier. The substrate can be tested, e.g., electrically tested, through or via the exposed portion of the first surface of the substrate. The substrate can be tested, e.g., electrically tested, from the side of the first surface of the substrate. The testing process may be performed before and/or after processing the exposed portion of the first surface of the substrate.

A testing process, in particular, an electrical testing process, may also be performed on the second surface of the substrate. The testing process on the second surface of the substrate may be performed before, after or at the same time as the testing process on the exposed portion of the first surface of the substrate. In particular, the support of the substrate by the carrier, avoiding any deformation, such as warpage, of the substrate, allows for efficient and reliable simultaneous testing, e.g., electrical testing, on the first and second surfaces of the substrate.

The method of the invention may further comprise processing the second surface of the substrate. The second surface of the substrate can be processed in a state in which the substrate is attached to the carrier. Thus, even very thin substrates can be efficiently and safely handled during processing. The substrate can be processed through the second surface of the substrate. The substrate can be processed from the side of the second surface of the substrate.

Processing the second surface of the substrate may consist of or comprise grinding and/or polishing and/or plasma etching and/or dry etching and/or wet etching the second substrate surface. In this process or these processes, the substrate may be adjusted to a desired thickness, e.g., the final substrate thickness. In some embodiments, only a grinding process but no polishing process may be performed on the second surface of the substrate.

The method of the invention allows for the modified layer to be formed in a particularly well-defined manner and with a high degree of accuracy, so that substrates with a reduced thickness and a high degree of thickness uniformity can be achieved. In particular, the present method allows for the modified layer to be formed at a reduced depth inside the workpiece, i.e., at a reduced distance from the first surface of the workpiece in the thickness direction of the workpiece. Hence, the amount of substrate material to be removed in the grinding and/or polishing process is significantly reduced, thereby minimising material loss.

For example, the thickness of the substrate may be reduced in the grinding and/or polishing process by 30 μm to 100 μm, preferably by 40 μm to 80 μm, more preferably by 50 μm to 70 μm and even more preferably by approximately 50 μm.

The process of polishing the second surface of the substrate may comprise or consist of chemical mechanical polishing (CMP), dry polishing (DP) and/or other types of polishing processes.

The method of the invention may further comprise, after dividing the workpiece along the modified layer, grinding and/or polishing and/or plasma etching and/or dry etching and/or wet etching a surface of a remainder of the workpiece, the surface being opposite the second surface of the workpiece. This surface of the remainder of the workpiece is a surface which is exposed by dividing the workpiece along the modified layer. By applying such a process or such processes to the surface of the remainder of the workpiece, the remainder of the workpiece can be efficiently prepared for obtaining a further substrate therefrom. In particular, by polishing the surface of the remainder of the workpiece, a smooth surface is achieved. The process of obtaining a further substrate or further substrates from the remainder of the workpiece will be detailed below.

Since the method of the invention allows for the modified layer to be formed in a particularly well-defined manner and with a high degree of accuracy, also the amount of workpiece material to be removed in the process of grinding and/or polishing the remainder of the workpiece is considerably reduced. Thus, also in this regard, material loss is minimised.

For example, the thickness of the remainder of the workpiece may be reduced in the grinding and/or polishing process by 30 μm to 100 μm, preferably by 40 μm to 80 μm, more preferably by 50 μm to 70 μm and even more preferably by approximately 50 μm.

The process of polishing the surface of the remainder of the workpiece may comprise or consist of chemical mechanical polishing (CMP), dry polishing (DP) and/or other types of polishing processes.

After dividing the workpiece along the modified layer, the above-described steps of attaching a carrier to the workpiece, forming a modified layer, dividing the workpiece and removing carrier material may be repeated one or more times on a remainder of the workpiece, so as to obtain a plurality of, e.g., two or more, three or more, five or more, eight or more, ten or more, or twelve or more, substrates. In this way, plural substrates can be obtained from a single workpiece in an efficient and reliable manner. In particular, the method of the invention allows for the number of substrates to be obtained from the workpiece to be increased, as has been explained in detail above.

Preferably, the above-described steps of attaching a carrier to the workpiece, forming a modified layer, dividing the workpiece and removing carrier material are repeated one or more times on the remainder of the workpiece, so as to obtain a plurality of substrates, after grinding and/or polishing a surface of the remainder of the workpiece, the surface being opposite the second surface of the workpiece.

The above-described steps of attaching a carrier to the workpiece, forming a modified layer, dividing the workpiece and removing carrier material may be repeated on the remainder of the workpiece until a thickness of the remainder of the workpiece reaches a lower limit, e.g., until the remainder of the workpiece becomes too thin to obtain a further substrate therefrom.

The method of the invention may further comprise forming a functional layer on the second surface of the substrate. The functional layer can be formed on the second surface of the substrate in a state in which the substrate is attached to the carrier. Thus, even very thin substrates can be efficiently and safely handled during forming the functional layer. The functional layer may be formed on the second substrate surface after processing, e.g., grinding and/or polishing, the second substrate surface.

The functional layer is a layer which provides or exhibits a functionality. This functionality may be, for example, an electrical functionality, such as electrical insulation or conductance, a mechanical functionality, such as mechanical protection, or an electronic functionality, e.g., for the case of a device layer as functional layer.

For example, the functional layer may be a device layer, an epitaxial layer, a GaN layer, a buffer layer, such as a recombination-enhanced buffer layer, a metal layer, a low-k layer or the like. The functional layer may have interconnections, such as bumps, e.g., solder bumps or copper pillar bumps.

In particular, the functional layer may be a device layer. The device layer may comprise devices, such as electronic devices, semiconductor devices, e.g., for power semiconductors, or the like. The devices may comprise or be, for example, transistors, such as MOSFETs, e.g., SiC MOSFETs, or insulated-gate bipolar transistors (IGBTs), or diodes, e.g., Schottky barrier diodes. Particularly preferably, the devices are semiconductor devices, in particular, for power semiconductors designed for power saving products.

The functional layer, in particular, the device layer, may be formed on the second surface of the substrate by epitaxial growth and/or patterning. In particular, an epitaxial layer may be formed on the second substrate surface by epitaxial growth. Subsequently, the epitaxial layer may be subjected to a patterning process, e.g., by lithography, so as to obtain the functional layer, in particular, the device layer.

The functional layer, in particular, the device layer, may be formed only in a central portion of the second surface of the substrate. In particular, in this central portion, a device area comprising a plurality of devices may be formed. The device area may further have a plurality of division lines, partitioning the plurality of devices. A peripheral marginal area having no functional layer, in particular, no devices, may be formed around the central portion of the second surface of the substrate. The peripheral marginal area of the second surface of the substrate may have a substantially annular shape or an annular shape. The peripheral marginal area may have a ring width of 1 mm to 3 mm. The ring width is defined as half the difference of the outer diameter of the peripheral marginal area and the inner diameter of the peripheral marginal area.

Alternatively, the functional layer, in particular, the device layer, may be formed on the entire second surface of the substrate.

In the method of the invention, the entire first surface of the carrier may be attached to the first surface of the workpiece. In this way, the carrier can be particularly reliably attached to the workpiece.

Alternatively, only the peripheral portion of the first surface of the carrier may be attached to the first surface of the workpiece. In particular, the peripheral portion of the first surface of the carrier may be attached to a peripheral portion of the first surface of the workpiece. In a central portion of the first surface of the carrier, the carrier and the workpiece may be unattached to each other. The peripheral portion of the first surface of the carrier may surround the central portion of the first surface of the carrier. In a central portion of the first surface of the workpiece, the carrier and the workpiece may be unattached to each other. The peripheral portion of the first surface of the workpiece may surround the central portion of the first surface of the workpiece.

Attaching only the peripheral portion of the first surface of the carrier to the first surface of the workpiece further facilitates the process of removing carrier material from the side of the second surface of the carrier in the central portion of the carrier. In particular, a recess extending through the entire thickness of the carrier can be formed in the carrier in an especially efficient manner. In the area in which carrier and workpiece are not attached to each other, carrier material can be removed in a particularly simple way, for example, by cutting the carrier, as will be described in further detail below.

The peripheral portion of the first surface of the carrier may have a substantially annular shape or an annular shape. The peripheral portion of the first surface of the carrier may have a ring width of 1 mm to 3 mm. The ring width is defined as half the difference of the outer diameter of the peripheral portion of the first surface of the carrier and the inner diameter of the peripheral portion of the first surface of the carrier.

The peripheral portion of the first surface of the workpiece may have a substantially annular shape or an annular shape. The peripheral portion of the first surface of the workpiece may have a ring width of 1 mm to 3 mm. The ring width is defined as half the difference of the outer diameter of the peripheral portion of the first surface of the workpiece and the inner diameter of the peripheral portion of the first surface of the workpiece.

Carrier material may be removed in the entire area in which carrier and workpiece are not attached, i.e., unattached, to each other. The peripheral portion of the carrier, surrounding the recess formed in the central portion of the carrier, may correspond to the peripheral portion of the first surface of the carrier at which the carrier is attached to the workpiece. The peripheral portion of the carrier, surrounding the recess formed in the central portion of the carrier, may be congruent with the peripheral portion of the first surface of the carrier at which the carrier is attached to the workpiece.

The peripheral portion of the carrier, surrounding the recess formed in the central portion of the carrier, may correspond to the peripheral marginal area of the second surface of the substrate. The peripheral portion of the carrier, surrounding the recess formed in the central portion of the carrier, may be congruent with the peripheral marginal area of the second surface of the substrate.

The peripheral portion of the first surface of the carrier may correspond to the peripheral marginal area of the second surface of the substrate. The peripheral portion of the first surface of the carrier may be congruent with the peripheral marginal area of the second surface of the substrate.

The at least a peripheral portion of the first surface of the carrier may be attached to the first surface of the workpiece so that the first surface of the carrier is in direct contact with the first surface of the workpiece. The entire first surface of the carrier may be attached to the first surface of the workpiece so that the first surface of the carrier is in direct contact with the first surface of the workpiece. Only the peripheral portion of the first surface of the carrier may be attached to the first surface of the workpiece so that the first surface of the carrier is in direct contact with the first surface of the workpiece.

If the at least a peripheral portion of the first surface of the carrier is attached to the first surface of the workpiece so that the first surface of the carrier is in direct contact with the first surface of the workpiece, no material, in particular, no adhesive, is present between the first surface of the carrier and the first surface of the workpiece. Hence, after dividing the workpiece, the substrate can be held particularly efficiently and reliably by the carrier during further handling and/or processing. In particular, any weakening of the attachment between carrier and substrate and/or any contamination during high temperature processes, such as metallization, e.g., due to the melting of an adhesive layer and/or the generation of gases by the adhesive layer, can be reliably avoided.

Herein, the term "direct contact" encompasses, i.e., covers, embodiments in which an oxide layer, in particular, an oxide layer of the carrier material, is formed on the first surface of the carrier and/or an oxide layer, in particular, an oxide layer of the workpiece material, is formed on the first surface of the workpiece. Herein, such oxide layers do not constitute material, i.e., additional material, present between the first surface of the carrier and the first surface of the workpiece. For example, if the carrier is made of Si, a silicon oxide ($SiO_2$) layer may be formed on the first surface of the carrier. For instance, if the workpiece is made of SiC, a silicon oxide ($SiO_2$) layer may be formed on the first surface of the workpiece.

The at least a peripheral portion of the first surface of the carrier may be attached to the first surface of the workpiece so that no adhesive is present between the first surface of the carrier and the first surface of the workpiece. In this way, any weakening of the attachment between carrier and substrate and/or any contamination during high temperature processes, such as metallization, e.g., due to the melting of an adhesive layer and/or the generation of gases by the adhesive layer, can be reliably avoided.

The at least a peripheral portion of the first surface of the carrier may be attached to the first surface of the workpiece so that the carrier is permanently, i.e., non-detachably, attached to the workpiece. In this case, the carrier cannot be removed, i.e., detached, from the workpiece or the substrate without damaging or destroying at least one of the carrier and the workpiece or the substrate. If the carrier is permanently, i.e., non-detachably, attached to the workpiece and, thus, also to the substrate, the carrier may be removed from the substrate at a later stage, e.g., after processing and/or testing of the substrate has been finished, for example, by cutting and/or grinding the carrier and/or the substrate.

The at least a peripheral portion of the first surface of the carrier may be attached to the first surface of the workpiece by a material bond (also termed "chemical bond"), such as an adhesive bond. The terms "material bond" and "adhesive bond" define an attachment or connection between carrier and workpiece due to atomic and/or molecular forces acting between these two components. The term "adhesive bond" relates to the presence of these atomic and/or molecular forces, which act so as to attach or adhere the carrier to the workpiece, and does not imply the presence of an additional adhesive between carrier and workpiece.

The at least a peripheral portion of the first surface of the carrier may be attached to the first surface of the workpiece by fusion bonding (also termed "direct bonding") and/or anodic bonding. The entire first surface of the carrier may be attached to the first surface of the workpiece by fusion bonding and/or anodic bonding. Only the peripheral portion of the first surface of the carrier may be attached to the first surface of the workpiece by fusion bonding and/or anodic bonding.

The at least a peripheral portion of the first surface of the carrier may be attached to the first surface of the workpiece by fusion bonding. The at least a peripheral portion of the first surface of the carrier may be attached to the first surface of the workpiece by anodic bonding. The at least a peripheral portion of the first surface of the carrier may be attached to the first surface of the workpiece by fusion bonding and anodic bonding.

By attaching the at least a peripheral portion of the first surface of the carrier to the first surface of the workpiece by fusion bonding and/or anodic bonding, the carrier can be attached to the workpiece in a particularly reliable manner. After dividing the workpiece, the substrate can be especially securely held by the carrier during further handling and/or processing, in particular, during high temperature processes, such as metallization.

Attaching the at least a peripheral portion of the first surface of the carrier to the first surface of the workpiece may consist of or comprise heating the carrier and/or the workpiece, e.g., in a fusion bonding and/or anodic bonding process. By heating the carrier and/or the workpiece, a material bond, such as an adhesive bond, may be formed between the carrier and the workpiece.

Attaching the at least a peripheral portion of the first surface of the carrier to the first surface of the workpiece may consist of or comprise applying an electric field, in particular, an electrostatic field, to the carrier and/or the workpiece, e.g., in an anodic bonding process or in a fusion bonding and anodic bonding process. By applying the electric field, in particular, the electrostatic field, to the carrier and/or the workpiece, a material bond, such as an adhesive bond, may be formed between the carrier and the workpiece.

Attaching the at least a peripheral portion of the first surface of the carrier to the first surface of the workpiece may consist of or comprise heating the carrier and/or the workpiece and applying an electric field, in particular, an electrostatic field, to the carrier and/or the workpiece, e.g., in an anodic bonding process or in a fusion bonding and anodic bonding process. By heating the carrier and/or the workpiece and applying the electric field, in particular, the electrostatic field, to the carrier and/or the workpiece, a material bond, such as an adhesive bond, may be formed between the carrier and the workpiece.

Before attaching the at least a peripheral portion of the first surface of the carrier to the first surface of the workpiece, in particular, by fusion bonding and/or anodic bonding, the at least a peripheral portion of the first surface of the carrier and/or the first surface of the workpiece may be subjected to a pretreatment process. In this way, the attachment of the carrier to the workpiece can be further improved. In particular, the at least a peripheral portion of the first surface of the carrier and/or the first surface of the workpiece may be pretreated so as to exhibit a certain degree of surface roughness, e.g., a surface roughness of less than 1 nm, preferably less than 0.5 nm. The at least a peripheral portion of the first surface of the carrier and/or the first surface of the workpiece may be cleaned, in particular, so as to obtain a very clean surface or surfaces. For example, the at least a peripheral portion of the first surface of the carrier and/or the first surface of the workpiece may be cleaned by dry cleaning, e.g., plasma cleaning or UV/ozone cleaning, or by wet chemical cleaning.

The pretreatment process may consist of or comprise grinding and/or polishing and/or etching the at least a peripheral portion of the first surface of the carrier and/or the first surface of the workpiece. Etching the at least a peripheral portion of the first surface of the carrier and/or the first surface of the workpiece may consist of or comprise dry etching and/or plasma etching and/or wet etching the at least a peripheral portion of the first surface of the carrier and/or the first surface of the workpiece. In particular, the at least a peripheral portion of the first surface of the carrier and/or the first surface of the workpiece may be subjected to a grinding process or to a grinding process and an optional subsequent polishing process.

The pretreatment process may comprise modifying or optimizing the surface roughness of the at least a peripheral portion of the first surface of the carrier and/or the first surface of the workpiece and/or forming a layer, such as a metal layer, on the at least a peripheral portion of the first surface of the carrier and/or the first surface of the workpiece, e.g., after grinding and/or polishing. In particular, the pretreatment process may comprise forming an oxide layer, in particular, an oxide layer of the carrier material, on the first surface of the carrier and/or forming an oxide layer, in particular, an oxide layer of the workpiece material, on the first surface of the workpiece. For example, the pretreatment process may comprise forming a silicon oxide ($SiO_2$) layer on the first surface of the carrier, e.g., if the carrier is made of Si. For instance, the pretreatment process may comprise forming a silicon oxide ($SiO_2$) layer on the first surface of the workpiece, e.g., if the workpiece is made of SiC. Such a formation of an oxide layer or oxide layers can help to further enhance the attachment of the at least a peripheral portion of the first surface of the carrier to the first surface of the workpiece, in particular, in a fusion bonding process or in a fusion bonding and anodic bonding process.

In the method of the invention, removing carrier material from the side of the second surface of the carrier in the central portion of the carrier may consist of or comprise grinding the carrier and/or polishing the carrier and/or cutting the carrier and/or etching the carrier.

The carrier material may be removed in a single material removal step or in a plurality of material removal steps, e.g., a sequence of material removal steps. For example, the carrier material may be removed in a single grinding step, a single polishing step, a single cutting step or a single etching step. Alternatively, the carrier material removal process may consist of or comprise two or more of such steps.

For example, a recess may be formed in the carrier first, e.g., by grinding the carrier, in the central portion of the carrier, wherein the recess does not extend through the entire thickness of the carrier. In this case, a layer of carrier material, i.e., a continuous layer of carrier material, remains on the first surface of the substrate. This layer may be a thin layer, e.g., having a thickness in the range of 1 µm to 100 µm. Subsequently, this layer may be removed, for example, by etching, such as plasma etching, dry etching and/or wet etching, and/or by cutting, such as blade cutting, laser cutting and/or plasma cutting, thereby forming a recess extending through the entire thickness of the carrier. In this way, a portion of the first surface of the substrate is exposed. By forming the recess, extending through the entire thickness of the carrier, in such a manner, it can be particularly reliably avoided that the substrate may be damaged, e.g., in the process of grinding the carrier.

In some embodiments, a recess extending through the entire thickness of the carrier may be formed in the carrier in a single material removal step, e.g., in a single grinding and/or polishing step. In this case, the material removal process can be efficiently combined with a process of pretreating the first surface of the substrate, in particular, the exposed portion thereof, e.g., for further processing. In particular, the recess extending through the entire thickness of the carrier may be formed by grinding and/or polishing the carrier. In this grinding and/or polishing process, the exposed portion of the first surface of the substrate can be also, at least to a certain extent, e.g., slightly, ground and/or polished. In this way, the properties, in particular, the surface roughness, of this exposed portion can be adjusted so as to suitably pretreat the exposed portion for the further processing thereof. For example, the surface roughness of the exposed portion can be adjusted so as to enhance the adhesion of a metal layer or metal coating to be deposited on the exposed portion in a subsequent metallization process, e.g., a metallization process as detailed above.

In the method of the invention, etching the carrier may comprise or consist of plasma etching the carrier and/or dry etching the carrier and/or wet etching the carrier.

Cutting the carrier may comprise or consist of blade cutting the carrier and/or laser cutting the carrier and/or plasma cutting the carrier. For example, the carrier may be mechanically cut by using a blade or a saw. Alternatively or in addition, the carrier may be cut by using a laser cutting means, e.g., a laser cutting means configured to perform laser ablation.

Polishing the carrier may comprise or consist of chemical mechanical polishing (CMP), dry polishing (DP) and/or other types of polishing processes.

The step of removing carrier material from the side of the second surface of the carrier in the central portion of the carrier may be performed after dividing the workpiece along the modified layer. The step of removing carrier material from the side of the second surface of the carrier in the central portion of the carrier may be performed before dividing the workpiece along the modified layer. The step of removing carrier material from the side of the second surface of the carrier in the central portion of the carrier may be performed after attaching the carrier to the workpiece.

In the method of the invention, forming the modified layer inside the workpiece may comprise or consist of applying a laser beam to the workpiece. In this way, the modified layer can be formed in a particularly efficient and well-defined manner.

The workpiece may be made of a material which is transparent to the laser beam. Thus, the laser beam may have a wavelength which allows transmission of the laser beam through the workpiece. The laser beam may be applied to the workpiece at least in a plurality of positions along the first surface of the workpiece. The laser beam may be applied to the workpiece in a condition where a focal point of the laser beam is located at a distance from the first surface of the workpiece in the direction from the first surface of the workpiece towards the second surface of the workpiece. The focal point of the laser beam may be located inside the workpiece.

If forming the modified layer inside the workpiece comprises or consists of applying a laser beam to the workpiece, the workpiece is modified in the modified layer, at least in some regions of the workpiece, by the application of the laser beam. The modified layer may consist of or comprise regions of the workpiece in which the structure of the workpiece material has been modified by the application of the laser beam. These regions may be regions of the workpiece in which the workpiece has been damaged by the application of the laser beam.

The modified layer formed inside the workpiece may consist of or comprise a plurality of modified regions, as has been described above. If forming the modified layer inside the workpiece comprises or consists of applying a laser beam to the workpiece, the modified regions are regions of the workpiece which have been modified by the application of the laser beam. The modified regions may be regions of the workpiece in which the structure of the workpiece material has been modified by the application of the laser beam. The modified regions may be regions of the workpiece in which the workpiece has been damaged by the application of the laser beam.

The modified regions may comprise amorphous regions and/or regions in which cracks are formed. The modified regions may be amorphous regions or regions in which cracks are formed.

The modified regions may each comprise a space, e.g., a cavity, inside the workpiece material, the space being surrounded by an amorphous region and/or a region in which cracks are formed.

The modified regions may each be composed of a space, e.g., a cavity, inside the workpiece material and an amorphous region and/or a region in which cracks are formed surrounding the space.

If the modified regions comprise or are regions in which cracks are formed, i.e., cracks have been formed, the cracks may be microcracks. The cracks may have dimensions, e.g., lengths and/or widths, in the µm range. For example, the cracks may have widths in the range of 5 µm to 100 µm and/or lengths in the range of 100 µm to 1000 µm.

The modified regions may have diameters in the range of 1 µm to 30 µm, preferably 2 µm to 20 µm and more preferably 3 µm to 10 µm.

The laser beam may be a pulsed laser beam. The pulsed laser beam may have a pulse width, for example, in the range of 1 fs to 1000 ns, preferably in the range of 1 ns to 300 ns.

The laser beam may be applied to the workpiece from the side of the first surface of the workpiece.

The carrier may be made of a material which is transparent to the laser beam. Thus, the laser beam may have a wavelength which allows transmission of the laser beam through the carrier.

The laser beam may be applied to the workpiece after attaching the carrier to the workpiece. In this case, the modified layer can be formed from the side of the first surface of the workpiece by using a laser beam having a wavelength which allows transmission of the laser beam through the carrier.

Applying the laser beam to the workpiece from the side of the first surface of the workpiece is particularly advantageous if the thickness of the substrate to be obtained is considerably smaller than the thickness of the workpiece, e.g., by a factor of 3 or more, a factor of 5 or more, a factor of 8 or more, a factor of 10 or more, a factor of 15 or more or a factor of 20 or more. In this case, applying the laser beam from the side of the first surface of the workpiece requires a significantly smaller laser penetration depth, i.e., laser focus depth, in the workpiece than applying the laser beam from the side of the second surface of the workpiece. Hence, the modified layer can be formed particularly accurately, allowing for the thickness of the substrate to be obtained to be further reduced.

Further, due to the smaller laser penetration depth, a laser beam with lower power can be used for forming the modified layer, thus reducing the surface roughness of the second substrate surface after dividing the workpiece. Due to this reduction in surface roughness, a substrate with particularly high surface quality can be obtained. For example, in this way, an amount of surface grinding and/or polishing can be significantly reduced, thus minimising the loss of workpiece material and reducing the wear of grinding and/or polishing equipment.

Alternatively, the laser beam may be applied to the workpiece from the side of the second surface of the workpiece. This approach may be adopted, in particular, if the workpiece has a relatively small thickness, e.g., less than 2 mm.

The laser beam may be applied to the workpiece at least in a plurality of positions along the first surface of the workpiece in such a manner that adjacent ones of the positions do not overlap each other. The laser beam may be applied to the workpiece at least in a plurality of positions along the first surface in such a manner that a distance between adjacent ones of the positions, i.e., a distance between centres of adjacent positions, is within a range of 3 µm to 50 µm, preferably 5 µm to 40 µm and more preferably 8 µm to 30 µm.

The plurality of modified regions may be formed inside the workpiece so that adjacent or neighbouring modified regions do not overlap each other. In this way, it can be particularly reliably ensured that the workpiece maintains a high degree of strength or robustness for allowing efficient further handling and/or processing thereof. In particular, the possible risk of the workpiece being unintentionally divided during handling thereof can be significantly reduced.

The distance between outer edges of adjacent or neighbouring modified regions may be at least 1 µm.

The laser beam may be applied to the workpiece at least in a plurality of positions along the first surface of the workpiece in such a manner that adjacent ones of the positions at least partially overlap each other.

The plurality of modified regions may be formed in the workpiece so that adjacent or neighbouring modified regions at least partially overlap each other. In this way, the process of dividing the workpiece along the modified layer can be further facilitated.

The modified layer may be formed so as to be substantially parallel to the first surface of the workpiece. In this way, a substrate with a high degree of thickness uniformity can be obtained in a particularly efficient and simple manner.

The modified layer may be formed so as to be closer to the first surface of the workpiece than to the second surface of the workpiece in the thickness direction of the workpiece. For example, the modified layer may be formed so that a distance between the modified layer and the first surface in the thickness direction of the workpiece is smaller than a distance between the modified layer and the second surface in the thickness direction of the workpiece by a factor of 3 or more, a factor of 5 or more, a factor of 8 or more, a factor of 10 or more, a factor of 15 or more or a factor of 20 or more.

The modified layer may be formed so that a distance between the modified layer and the first surface in the thickness direction of the workpiece is larger than the thickness, e.g., the final thickness, of the substrate to be obtained, e.g., by 30 µm to 100 µm, preferably by 40 µm to 80 µm, more preferably by 50 µm to 70 µm and even more preferably by approximately 50 µm. Herein, the term "final thickness" defines the thickness of the substrate after processing of the substrate has been completed or finished, e.g., after all processing steps, such as grinding and/or polishing the substrate, have been carried out. In this way, the loss of workpiece material in the process of obtaining the substrate can be further reduced.

The modified layer may be formed substantially over an entire cross-section of the workpiece. The cross-section may be substantially perpendicular to the thickness direction of the workpiece.

Dividing the workpiece along the modified layer may comprise or consist of applying an external stimulus to the workpiece, in particular, to the workpiece having the carrier attached thereto.

Applying the external stimulus to the workpiece may comprise or consist of applying an ultrasonic wave to the workpiece and/or applying pressure to the workpiece and/or applying a mechanical force to the workpiece and/or heating the workpiece and/or cooling the workpiece and/or applying a vacuum to the workpiece. Particularly preferably, applying the external stimulus to the workpiece comprises or consists of applying an ultrasonic wave to the workpiece.

By applying the external stimulus to the workpiece, the workpiece is separated in the area where the modified layer is formed. In this area, the strength of the workpiece is reduced due to the presence of the modified layer, thus facilitating separation of the workpiece by the application of the external stimulus. The workpiece may be fully divided along the modified layer by applying the external stimulus, thereby obtaining the substrate having the carrier attached thereto.

The invention further provides a system for producing a substrate. The system comprises a support member for supporting a workpiece, the workpiece having a first surface and a second surface opposite the first surface, and an attaching means configured to attach a carrier to the workpiece, wherein the carrier has a first surface and a second surface opposite the first surface, and at least a peripheral portion of the first surface of the carrier is attached to the first surface of the workpiece. The system further comprises a modified layer forming means configured to form a modified layer inside the workpiece and a dividing means configured to divide the workpiece along the modified layer, thereby obtaining the substrate, wherein the substrate has the carrier attached thereto. Moreover, the system comprises a material removing means configured to remove carrier material from the side of the second surface of the carrier in a central portion of the carrier so as to form a recess in the carrier.

The substrate producing system of the invention is a system configured for performing the substrate producing method of the invention. The substrate producing system thus provides the technical effects and advantages already described in detail above for the substrate producing method.

The features described above for the substrate producing method of the invention also apply to the substrate producing system of the invention.

The workpiece, the substrate, the carrier, the modified layer, the modified regions and the recess may be the same as described above.

The substrate producing system may comprise a control for controlling the components of the system. The control may comprise a plurality of control units, e.g., control units for controlling different components of the system. The control units may be separate or individual control units.

The control may be configured to control the substrate producing system so as to perform the substrate producing method of the invention.

The control may be configured to control the attaching means so as to attach the carrier to the workpiece, wherein the at least a peripheral portion of the first surface of the carrier is attached to the first surface of the workpiece. The control may be configured to control the attaching means so as to attach the at least a peripheral portion of the first surface of the carrier to the first surface of the workpiece. The control may be configured to control the modified layer forming means so as to form the modified layer inside the workpiece. The control may be configured to control the dividing means so as to divide the workpiece along the modified layer, thereby obtaining the substrate, wherein the substrate has the carrier attached thereto. The control may be configured to control the material removing means so as to remove carrier material from the side of the second surface of the carrier in the central portion of the carrier so as to form the recess in the carrier.

The substrate producing system of the invention may comprise or consist of a single apparatus or machine. Alternatively, the substrate producing system of the invention may comprise or consist of a plurality of apparatuses or machines, e.g., a plurality of separate or individual apparatuses or machines. These apparatuses or machines may be arranged, e.g., connected to each other, so as to form an in-line system. One, some or all of the apparatuses or machines may be configured to perform one step or a plurality of steps of the substrate producing method of the invention.

The support member may comprise or be, for example, a chuck table or the like.

The modified layer forming means may be configured to form the modified layer inside the workpiece from the side of the first surface of the workpiece. The modified layer forming means may be configured to form the modified layer inside the workpiece from the side of the second surface of the workpiece.

The modified layer forming means may comprise or consist of a laser beam applying means configured to apply a laser beam to the workpiece, in particular, to the workpiece supported by the support member. Forming the modified layer inside the workpiece may comprise or consist of applying the laser beam to the workpiece. The laser beam applied to the workpiece by the laser beam applying means may have a wavelength that allows transmission of the laser beam through the workpiece. The laser beam applying means may be configured to apply the laser beam to the workpiece at least in a plurality of positions along the first surface of the workpiece. The laser beam applying means may be configured to apply the laser beam to the workpiece in a condition where a focal point of the laser beam is located at a distance from the first surface of the workpiece in the direction from the first surface of the workpiece towards the second surface of the workpiece. The laser beam applying means may be configured to apply the laser beam to the workpiece in a condition where the focal point of the laser beam is located inside the workpiece.

The laser beam applying means may be configured to apply a pulsed laser beam to the workpiece. The pulsed laser beam may have a pulse width, for example, in the range of 1 fs to 1000 ns, preferably in the range of 1 ns to 300 ns.

The laser beam applying means may be configured to apply the laser beam to the workpiece from the side of the first surface of the workpiece. The laser beam applying means may be configured to apply the laser beam to the workpiece from the side of the second surface of the workpiece.

The laser beam applying means may be configured to apply the laser beam to the workpiece at least in a plurality of positions along the first surface of the workpiece in such a manner that adjacent ones of the positions do not overlap each other. The laser beam applying means may be configured to apply the laser beam to the workpiece at least in a plurality of positions along the first surface of the workpiece in such a manner that a distance between adjacent ones of the positions, i.e., a distance between centres of adjacent positions, is within a range of 3 µm to 50 µm, preferably 5 µm to 40 µm and more preferably 8 µm to 30 µm. The distance between outer edges of adjacent or neighbouring modified regions may be at least 1 µm.

The laser beam applying means may be configured to apply the laser beam to the workpiece at least in a plurality of positions along the first surface of the workpiece in such a manner that adjacent ones of the positions at least partially overlap each other.

The modified layer forming means may be configured to form the modified layer so as to be substantially parallel to the first surface of the workpiece.

The modified layer forming means may be configured to form the modified layer so as to be closer to the first surface of the workpiece than to the second surface of the workpiece in the thickness direction of the workpiece. For example, the modified layer forming means may be configured to form the modified layer so that a distance between the modified layer and the first surface of the workpiece in the thickness direction of the workpiece is smaller than a distance between the modified layer and the second surface of the workpiece in the thickness direction of the workpiece by a factor of 3 or more, a factor of 5 or more, a factor of 8 or more, a factor of 10 or more, a factor of 15 or more or a factor of 20 or more.

The modified layer forming means may be configured to form the modified layer so that a distance between the modified layer and the first surface of the workpiece in the thickness direction of the workpiece is larger than the thickness, e.g., the final thickness, of the substrate to be obtained, e.g., by 30 µm to 100 µm, preferably by 40 µm to 80 µm, more preferably by 50 µm to 70 µm and even more preferably by approximately 50 µm.

The modified layer forming means may be configured to form the modified layer substantially over an entire cross-section of the workpiece. The cross-section may be substantially perpendicular to the thickness direction of the workpiece.

The attaching means may be configured to attach the entire first surface of the carrier to the first surface of the workpiece. The attaching means may be configured to attach only the peripheral portion of the first surface of the carrier to the first surface of the workpiece.

The attaching means may be configured to attach the at least a peripheral portion of the first surface of the carrier to the first surface of the workpiece so that the first surface of the carrier is in direct contact with the first surface of the workpiece.

The attaching means may comprise or consist of a fusion bonding means and/or an anodic bonding means.

The attaching means may consist of or comprise a heating means configured to heat the carrier and/or the workpiece. The attaching means may consist of or comprise an electric field applying means configured to apply an electric field, in particular, an electrostatic field, to the carrier and/or the workpiece.

The fusion bonding means may comprise a heating means configured to heat the carrier and/or the workpiece. The anodic bonding means may comprise a heating means configured to heat the carrier and/or the workpiece. The anodic bonding means may comprise an electric field applying means configured to apply an electric field, in particular, an electrostatic field, to the carrier and/or the workpiece. The anodic bonding means may comprise a heating means configured to heat the carrier and/or the workplace and an electric field applying means configured to apply an electric field, in particular, an electrostatic field, to the carrier and/or the workplace.

The substrate producing system of the invention may further comprise a pretreating means configured to perform a pretreatment process on the at least a peripheral portion of the first surface of the carrier and/or the first surface of the workplace, e.g., before attaching the at least a peripheral portion of the first surface of the carrier to the first surface of the workpiece, in particular, by fusion bonding and/or anodic bonding. The pretreatment process may be as described above.

The pretreating means may consist of or comprise a grinding means and/or a polishing means or a combined grinding and polishing means and/or an etching means. The etching means may consist of or comprise a dry etching means and/or a plasma etching means and/or a wet etching means. The grinding means or the combined grinding and polishing means may be configured to grind the at least a peripheral portion of the first surface of the carrier and/or the first surface of the workpiece. The polishing means or the combined grinding and polishing means may be configured to polish the at least a peripheral portion of the first surface of the carrier and/or the first surface of the workplace, in particular, after grinding the at least a peripheral portion of the first surface of the carrier and/or the first surface of the workpiece. The etching means may be configured to etch the at least a peripheral portion of the first surface of the carrier and/or the first surface of the workplace. The dry etching means may be configured to perform a dry etching process on the at least a peripheral portion of the first surface of the carrier and/or the first surface of the workpiece. The plasma etching means may be configured to perform a plasma etching process on the at least a peripheral portion of the first surface of the carrier and/or the first surface of the workpiece. The wet etching means may be configured to perform a wet etching process on the at least a peripheral portion of the first surface of the carrier and/or the first surface of the workpiece. The pretreating means may also consist of or comprise a combined grinding and polishing and etching means.

The pretreating means may consist of or comprise a means for modifying or optimizing the surface roughness of the at least a peripheral portion of the first surface of the carrier and/or the first surface of the workpiece. The pretreating means may consist of or comprise a means for forming a layer, such as a metal layer, on the at least a peripheral portion of the first surface of the carrier and/or the first surface of the workpiece, e.g., after grinding and/or polishing. In particular, the pretreating means may consist of or comprise a means for forming an oxide layer, in particular, an oxide layer of the carrier material, on the first surface of the carrier and/or forming an oxide layer, in particular, an oxide layer of the workplace material, on the first surface of the workpiece. For example, the means for forming an oxide layer may be configured to form a silicon oxide ($SiO_2$) layer on the first surface of the carrier and/or on the first surface of the workpiece.

The substrate producing system may further comprise a processing means for processing the second surface of the substrate.

The processing means for processing the second surface of the substrate may consist of or comprise a grinding means and/or a polishing means or a combined grinding and polishing means. The grinding means or the combined grinding and polishing means may be configured to grind the second surface of the substrate after dividing the workpiece along the modified layer. The polishing means or the combined grinding and polishing means may be configured to polish the second surface of the substrate after dividing the workpiece along the modified layer, in particular, after grinding the second surface of the substrate.

The processing means for processing the second surface of the substrate may consist of or comprise a plasma etching means and/or a dry etching means and/or a wet etching means. The plasma etching means may be configured to perform plasma etching on the second surface of the substrate after dividing the workpiece along the modified layer. The dry etching means may be configured to perform dry etching on the second surface of the substrate after dividing the workpiece along the modified layer. The wet etching means may be configured to perform wet etching on the second surface of the substrate after dividing the workpiece along the modified layer.

The grinding means or the combined grinding and polishing means further may be configured to grind a surface of a remainder of the workpiece, the surface being opposite the second surface of the workpiece, after dividing the workpiece along the modified layer. Alternatively, the substrate producing system may comprise a further grinding means or combined grinding and polishing means for this purpose.

The polishing means or the combined grinding and polishing means further may be configured to polish the surface of the remainder of the workpiece, after dividing the workpiece along the modified layer, in particular, after grinding the surface of the remainder of the workpiece. Alternatively, the substrate producing system may comprise a further polishing means or combined grinding and polishing means for this purpose.

The grinding means and/or the polishing means or the combined grinding and polishing means and/or the etching means, e.g., the dry etching means and/or the plasma etching means and/or the wet etching means, or the combined grinding and polishing and etching means of the pretreating means, if present, may also be used for the above purposes. Alternatively, different grinding means and/or polishing means or combined grinding and polishing means and/or etching means, e.g., dry etching means and/or plasma etching means and/or wet etching means, or combined grinding and polishing and etching means may be used.

The plasma etching means further may be configured to perform plasma etching on the surface of the remainder of the workpiece, after dividing the workpiece along the modified layer. Alternatively, the substrate producing system may comprise a further plasma etching means for this purpose.

The dry etching means further may be configured to perform dry etching on the surface of the remainder of the workpiece, after dividing the workpiece along the modified layer. Alternatively, the substrate producing system may comprise a further dry etching means for this purpose.

The wet etching means further may be configured to perform wet etching on the surface of the remainder of the workpiece, after dividing the workpiece along the modified layer. Alternatively, the substrate producing system may comprise a further wet etching means for this purpose.

The material removing means may consist of or comprise a grinding means and/or a polishing means and/or a combined grinding and polishing means and/or a cutting means and/or an etching means. For example, the material removing means may consist of or comprise a grinding means or a combined grinding and polishing means and an etching means. Further, for instance, the material removing means may consist of or comprise a grinding means or a combined grinding and polishing means and a cutting means. Also, the material removing means may consist of or comprise, e.g., a cutting means.

The grinding means and/or the polishing means or the combined grinding and polishing means of the material removing means may also be used for the above purposes. Alternatively, different grinding means and/or polishing means or combined grinding and polishing means may be used.

The etching means may consist of or comprise a plasma etching means and/or a dry etching means and/or a wet etching means.

The cutting means may consist of or comprise a blade cutting means and/or a laser cutting means and/or a plasma cutting means. For example, the blade cutting means may consist of or comprise a blade or a saw. The laser cutting means may be configured to perform laser ablation.

The polishing means or the combined grinding and polishing means may consist of or comprise a chemical mechanical polishing means and/or a dry polishing means and/or other types of polishing means.

The material removing means may be configured to expose a portion of the first surface of the substrate.

The substrate producing system may further comprise a processing means for processing the first surface of the substrate, in particular, the exposed portion of the first surface of the substrate.

The processing means for processing the first surface of the substrate, in particular, the exposed portion of the first surface of the substrate, may consist of or comprise a metallizing means configured to perform a metallization process on the exposed portion of the first surface of the substrate.

The substrate producing system may further comprise a testing means for performing a testing process, in particular, an electrical testing process, on the exposed portion of the first surface of the substrate.

The substrate producing system may further comprise a testing means for performing a testing process, in particular, an electrical testing process, on the second surface of the substrate. For performing the testing process, in particular, the electrical testing process, on the second surface of the substrate, the testing means for performing a testing process, in particular, an electrical testing process, on the exposed portion of the first surface of the substrate or a different testing means may be used.

The substrate producing system may further comprise a functional layer forming means configured to form a functional layer on the second surface of the substrate. The functional layer may be as described above.

The functional layer forming means may consist of or comprise an epitaxial growing means and/or a patterning means. The epitaxial growing means may be configured to form an epitaxial layer on the second substrate surface by epitaxial growth. The patterning means may be configured to perform a patterning process, e.g., a lithography process, on the second substrate surface, in particular, on an epitaxial layer formed on the second substrate surface.

The dividing means may comprise or consist of an external stimulus applying means configured to apply an external stimulus to the workpiece, in particular, to the workpiece having the carrier attached thereto.

The external stimulus applying means may be configured to apply an ultrasonic wave to the workpiece and/or to apply pressure to the workpiece and/or to apply a mechanical force to the workpiece and/or to heat the workpiece and/or to cool the workpiece and/or to apply a vacuum to the workpiece. Particularly preferably, the external stimulus applying means is configured to apply an ultrasonic wave to the workpiece.

The substrate producing system may be configured to repeat, after dividing the workpiece along the modified layer, the above-described steps of attaching a carrier to the workpiece, forming a modified layer, dividing the workpiece and removing carrier material one or more times on a remainder of the workpiece, so as to obtain a plurality of, e.g., two or more, three or more, five or more, eight or more, ten or more, or twelve or more, substrates.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods of producing a substrate and to substrate producing systems for performing these methods.

In the following, a first embodiment of the present invention will be described with reference to FIGS. 1 to 9.

In the first embodiment, the method of the invention is performed on a SiC ingot as a workpiece 2 (see, for example, FIGS. 1 to 4). In particular, the workpiece 2 may be a single crystal SiC ingot. However, different types of workpiece and, in particular, different workpiece materials may be used for the workpiece 2, as has been detailed above.

Figure 1:
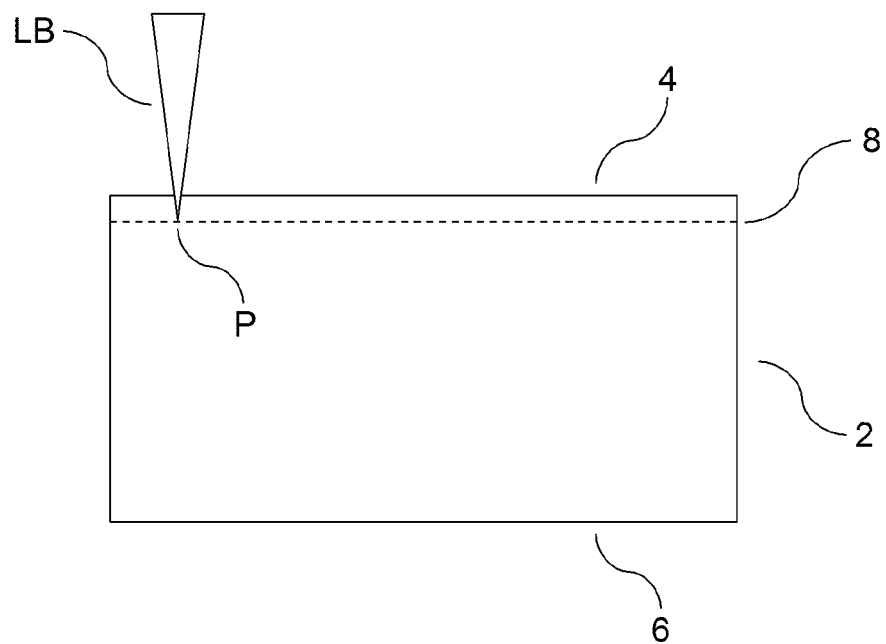
FIG. 1 is a cross-sectional view illustrating a step of applying a laser beam to a workpiece, thereby forming a modified layer inside the workpiece, according to a first embodiment of the method of the present invention.

As is shown in FIG. 1, the workpiece 2 has a first surface 4 and a second surface 6 opposite the first surface 4. The first surface 4 and the second surface 6 are substantially parallel to each other. For example, the workpiece 2 may have a thickness in the direction from the first surface 4 towards the second surface 6 in the range of 0.5 mm to 50 mm. However, the workpiece 2 also may have a thickness of more than 50 mm. The workpiece 2 has a substantially cylindrical shape.

A pulsed laser beam LB is applied to the workpiece 2 from the side of the first surface 4 of the workpiece 2 (see FIG. 1). The pulsed laser beam LB may have a pulse width, for example, in the range of 1 fs to 1000 ns, preferably in the range of 1 ns to 300 ns. The pulsed laser beam LB has a wavelength which allows transmission of the pulsed laser beam LB through the workpiece 2. The pulsed laser beam LB is applied to the workpiece 2 in a plurality of positions along the first surface 4, in a condition where a focal point P of the pulsed laser beam LB is located at a distance from the first surface 4 in the direction from the first surface 4 towards the second surface 6, i.e., located inside the workpiece 2 (see FIG. 1).

The pulsed laser beam LB is applied to the workpiece 2 by a laser beam applying means (not shown) of a substrate producing system (not shown) according to an embodiment of the present invention. In this embodiment, the laser beam applying means constitutes a modified layer forming means of the system. During the process of applying the pulsed laser beam LB to the workpiece 2, the workpiece 2 may be supported by a support member (not shown), such as a chuck table, of the substrate producing system.

Figure 2:
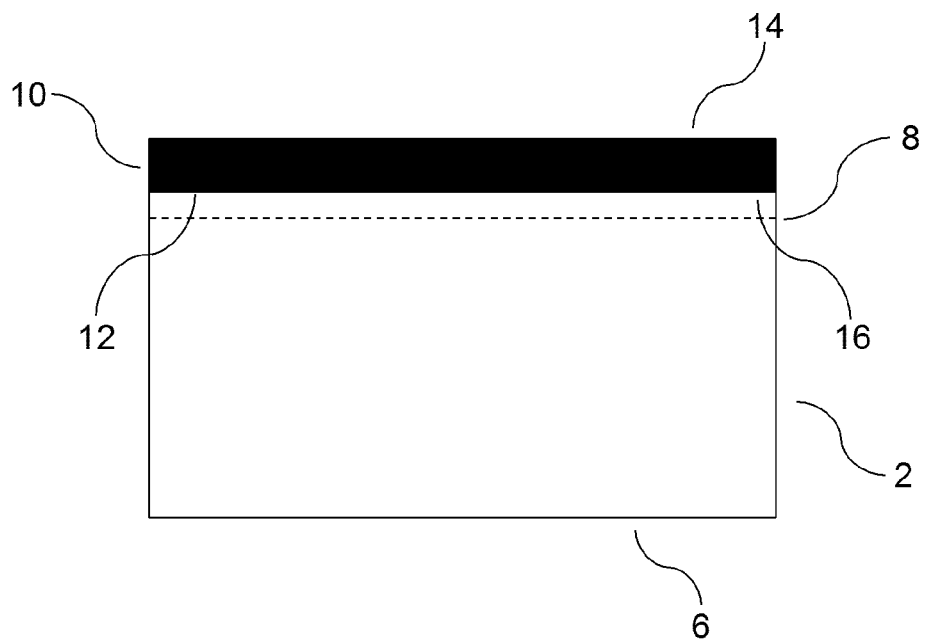
FIG. 2 is a cross-sectional view showing the outcome of a step of attaching a carrier to the workpiece according to the first embodiment of the method of the present invention.

By applying the pulsed laser beam LB to the workpiece 2 in this manner, a modified layer 8 is formed inside the workpiece 2 (see FIGS. 1 and 2). The modified layer 8 comprises a plurality of modified regions (not shown). The modified layer 8 faces the first surface 4 of the workpiece 2, i.e., the modified layer 8 is opposite the first surface 4 in the direction from the first surface 4 towards the second surface 6. The modified layer 8 is formed so as to be substantially parallel to the first surface 4.

The modified regions of the modified layer 8 are regions of the workpiece 2 which have been modified by the application of the pulsed laser beam LB. In particular, the modified regions may be regions of the workpiece 2 in which the structure of the workpiece material has been modified by the application of the pulsed laser beam LB and/or the workpiece 2 has been damaged by the application of the pulsed laser beam LB. By forming the modified layer 8 inside the workpiece 2, the strength of the workpiece 2 is reduced along the modified layer 8.

While, in the method of the first embodiment, the modified layer 8 is formed by applying a laser beam LB to the workpiece 2, the present invention is not limited to this approach. The modified layer 8 may be formed in the workpiece 2 in a different way, for example, by applying a different type of radiation to the workpiece 2.

The modified regions of the modified layer 8 may comprise amorphous regions and/or regions in which cracks are formed. The modified regions may be amorphous regions or regions in which cracks are formed. The modified regions may have diameters in the range of 1 μm to 30 μm, preferably 2 μm to 20 μm and more preferably 3 μm to 10 μm.

The modified layer 8 is formed substantially over an entire cross-section of the workpiece 2, the cross-section being substantially perpendicular to the thickness direction of the workpiece 2.

The pulsed laser beam LB may be applied to the workpiece 2 at least in a plurality of positions along the first surface 4 in such a manner that adjacent ones of the positions do not overlap each other. The pulsed laser beam LB may be applied to the workpiece 2 at least in a plurality of positions along the first surface 4 in such a manner that a distance between adjacent ones of the positions, i.e., a distance between centres of adjacent positions, is within a range of 3 μm to 50 μm, preferably 5 μm to 40 μm and more preferably 8 μm to 30 μm.

By applying the pulsed laser beam LB in this manner, the plurality of modified regions in the modified layer 8 can be formed inside the workpiece 2 so that adjacent or neighbouring modified regions do not overlap each other. The distance between outer edges of adjacent or neighbouring modified regions may be at least 1 μm.

Alternatively, the pulsed laser beam LB may be applied to the workpiece 2 at least in a plurality of positions along the first surface 4 in such a manner that adjacent ones of the positions at least partially overlap each other. In this way, the plurality of modified regions of the modified layer 8 may be formed in the workpiece 2 so that adjacent or neighbouring modified regions at least partially overlap each other.

As is further shown in FIG. 1, the modified layer 8 is formed so as to be closer to the first surface 4 of the workpiece 2 than to the second surface 6 of the workpiece 2 in the thickness direction of the workpiece 2.

The pulsed laser beam LB is applied to the workpiece 2 in a condition where the focal point P of the pulsed laser beam LB is located at a distance from the first surface 4 in the direction from the first surface 4 towards the second surface 6. Thus, the modified layer 8 is formed inside the workpiece 2 at this distance from the first surface 4 in the thickness direction of the workpiece 2 (see FIG. 1). In the present embodiment, the distance between the modified layer 8 and the first surface 4 in the thickness direction of the workpiece 2 may be larger than the final thickness of the substrate to be obtained, e.g., approximately 30 μm, by approximately 60 μm. The final thickness of the substrate to be obtained may also be less than 30 μm or more than 30 μm.

After forming the modified layer 8 inside the workpiece 2, a carrier 10 is attached to the workpiece 2 (see FIG. 2). The carrier 10 has a first surface 12 and a second surface 14 opposite the first surface 12. The first surface 12 and the second surface 14 are substantially parallel to each other. For example, the carrier 10 may have a thickness in the direction from the first surface 12 towards the second surface 14 in the range of 400 μm to 1200 μm, preferably 500 μm to 1000 μm. The carrier 10 has a substantially cylindrical shape. The carrier 10 has substantially the same diameter as the workpiece 2 (see FIG. 2).

The carrier 10 may be a semiconductor wafer, in particular, a Si wafer. However, different types of carrier and, in particular, different carrier materials may be used for the carrier 10, as has been detailed above.

In the method of the first embodiment, the entire first surface 12 of the carrier 10 may be attached to the first surface 4 of the workpiece 2. In this case, in the present embodiment, the entire first surface 12 of the carrier 10 is attached to the entire first surface 4 of the workpiece 2.

Alternatively, only a peripheral portion 16 of the first surface 12 of the carrier 10 may be attached to the first surface 4 of the workpiece 2 (see FIG. 2). In this case, the peripheral portion 16 of the first surface 12 of the carrier 10 is attached to a peripheral portion of the first surface 4 of the workpiece 2. In a central portion of the first surface 12 of the carrier 10, the carrier 10 and the workpiece 2 are unattached to each other. This central portion is surrounded by the peripheral portion 16. The peripheral portion 16 of the first surface 12 of the carrier 10 may have a substantially annular shape with a ring width, for example, in the range of 1 mm to 3 mm.

In the method of the present embodiment, the peripheral portion 16 of the first surface 12 of the carrier 10 or the entire first surface 12 of the carrier 10 is attached to the first surface 4 of the workpiece 2 by fusion bonding or anodic bonding. Also a combination of fusion bonding and anodic bonding may be used for this purpose. The peripheral portion 16 of the first surface 12 of the carrier 10 or the entire first surface 12 of the carrier 10 is attached to the first surface 4 of the workpiece 2 so that the first surface 12 of the carrier 10 is in direct contact with the first surface 4 of the workpiece 2. Thus, no material, in particular, no adhesive, is present between the first surface 12 of the carrier 10 and the first surface 4 of the workpiece 2. An oxide layer, in particular, an oxide layer of the carrier material, may be formed on the first surface 12 of the carrier 10 and/or an oxide layer, in particular, an oxide layer of the workpiece material, may be formed on the first surface 4 of the workpiece 2. In particular, if the carrier 10 is made of Si, e.g., if the carrier 10 is a Si wafer, a silicon oxide ($SiO_2$) layer may be formed on the first surface 12 of the carrier 10. As has been detailed above, in the present embodiment, the method of the invention is performed on a SiC ingot as the workpiece 2. A silicon oxide ($SiO_2$) layer may be formed on the first surface 4 of the workpiece 2, i.e., the SiC ingot.

The carrier 10 is attached to the workpiece 2 by an attaching means (not shown) of the substrate producing system of the present embodiment. In the present embodiment, the attaching means comprises or consists of a fusion bonding means and/or an anodic bonding means. During the process of attaching the carrier 10 to the workpiece 2, the workpiece 2 may be supported by the support member of the substrate producing system.

Before attaching the carrier 10 to the workpiece 2 by fusion bonding and/or anodic bonding, at least the peripheral portion 16 of the first surface 12 of the carrier 10 and/or the first surface 4 of the workpiece 2 may be subjected to a pretreatment process, as has been detailed above. In this way, the attachment of the carrier 10 to the workpiece 2 can be further improved. The pretreatment process may be performed by a pretreating means (not shown) of the substrate producing system of the present embodiment.

Figure 3:
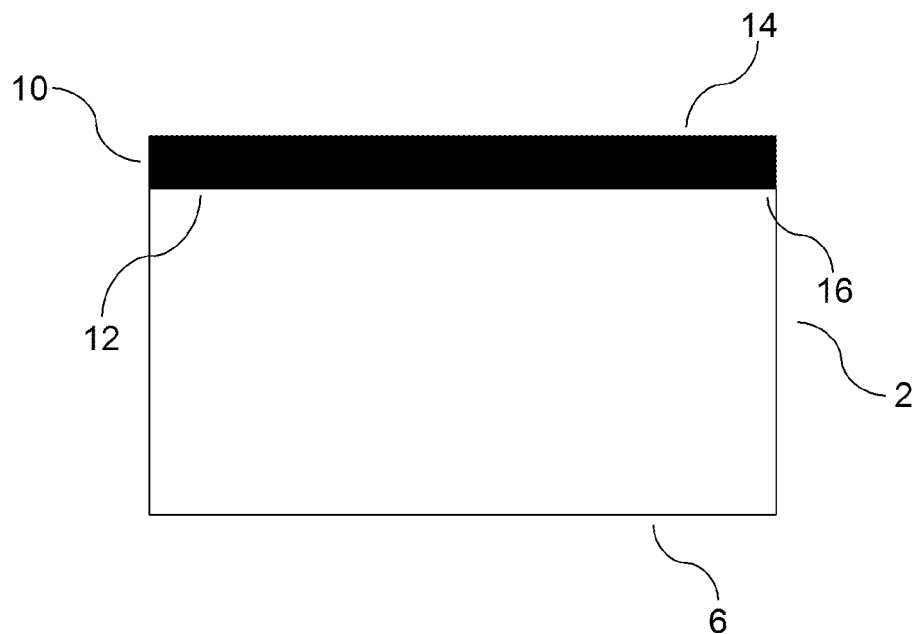
FIG. 3 is a cross-sectional view showing the outcome of a step of attaching a carrier to the workpiece according to a modification of the first embodiment of the method of the present invention.
Figure 4:
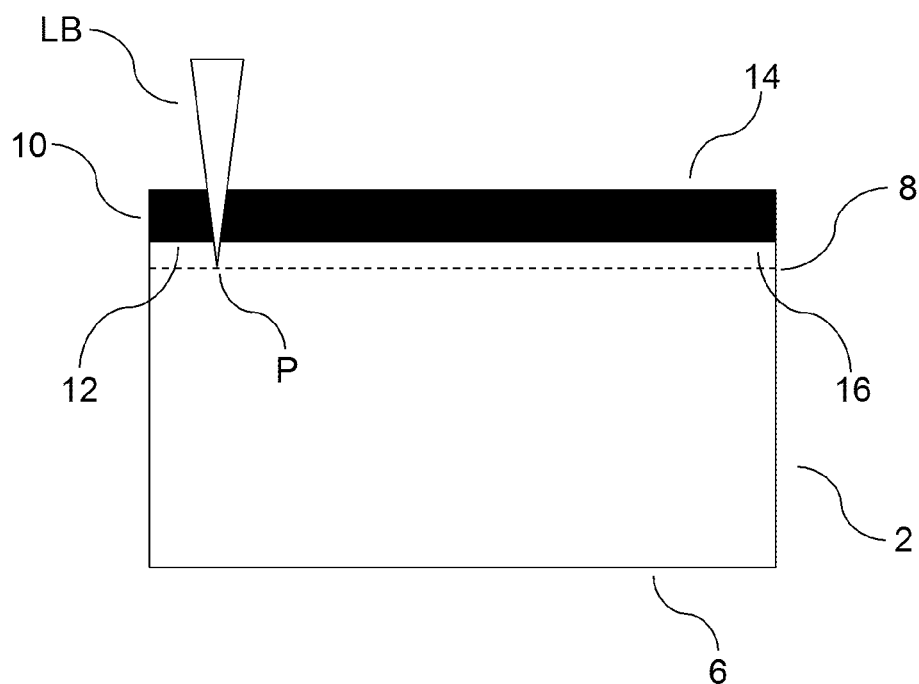
FIG. 4 is a cross-sectional view illustrating a step of applying a laser beam to the workpiece, thereby forming a modified layer inside the workpiece, according to a modification of the first embodiment of the method of the present invention.

FIGS. 3 and 4 illustrate a modification of the first embodiment of the method of the present invention. The method of this modification differs from the method of the first embodiment in the order of the steps of forming the modified layer 8 inside the workpiece 2 and attaching the carrier 10 to the workpiece 2.

Specifically, as is shown in FIG. 3, in the modified method, the carrier 10 is attached to the workpiece 2 first, i.e., before forming the modified layer 8 inside the workpiece 2. This attachment process is carried out in the same manner as detailed above for the method of the first embodiment. The carrier 10 is made of a material, e.g., Si, which is transparent to the laser beam LB. Thus, the laser beam LB has a wavelength which allows transmission of the laser beam LB through the carrier 10.

After attaching the carrier 10 to the workpiece 2, the pulsed laser beam LB is applied to the workpiece 2 from the side of the first surface 4 of the workpiece 2 substantially in the same manner as detailed above for the method of the first embodiment. The only difference between the laser application step of the method of the first embodiment and the laser application step of the modified method is that, in the latter method, the laser beam LB is transmitted through the carrier 10 (see FIG. 4). By applying the pulsed laser beam LB to the workpiece 2 in this manner, the modified layer 8 is formed inside the workpiece 2.

The remaining steps of the modified method are the same as those of the method according to the first embodiment which will be described in the following.

Figure 5:
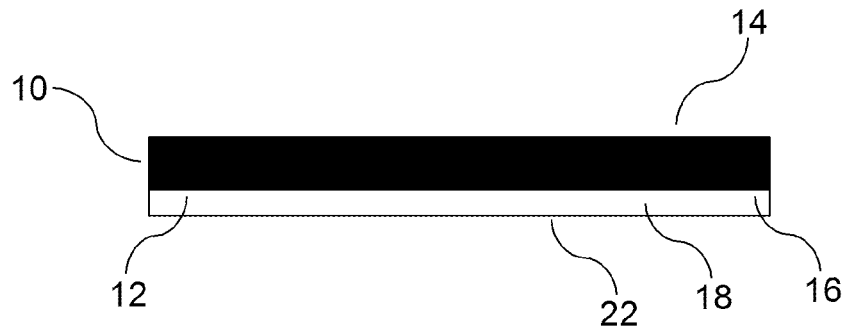
FIG. 5 is a cross-sectional view showing the outcome of a step of dividing the workpiece along the modified layer, thereby obtaining a substrate having the carrier attached thereto, according to the first embodiment of the method of the present invention.

After forming the modified layer 8 inside the workpiece 2 and attaching the carrier 10 to the workpiece 2, the workpiece 2 is divided along the modified layer 8, thereby obtaining a substrate 18 having the carrier 10 attached thereto (see FIG. 5). In the method of the present embodiment, the workpiece 2 is divided along the modified layer 8 by applying an external stimulus to the workpiece 2. The substrate producing system has a dividing means (not shown) comprising or consisting of an external stimulus applying means (not shown). The external stimulus is applied to the workpiece 2 by the external stimulus applying means.

In the present embodiment, applying the external stimulus to the workpiece 2 consists of applying an ultrasonic wave to the workpiece 2. However, other types of external stimulus may be applied to the workpiece 2, as has been detailed above.

By applying the external stimulus to the workpiece 2, the workpiece 2 is separated in the area where the modified layer 8 is formed. In this area, the strength of the workpiece 2 is reduced due to the presence of the modified regions, thus achieving separation of the workpiece 2 by the application of the external stimulus.

The outcome of the step of applying the external stimulus to the workpiece 2 is shown in FIG. 5. Since the modified layer 8 is formed substantially over the entire cross-section of the workpiece 2 (see FIGS. 1, 2 and 4), the workpiece 2 is fully divided along the modified layer 8 by applying the external stimulus, thereby obtaining the substrate 18 having the carrier 10 attached thereto. In the present embodiment, the substrate 18 is a SiC substrate.

The substrate 18 has a first surface 20 (see FIG. 7), which is the same as the first surface 4 of the workpiece 2, and a second surface 22 opposite the first surface 20 (e.g., FIG. 5). The first surface 20 and the second surface 22 are substantially parallel to each other. In the present embodiment, after dividing the workpiece 2 along the modified layer 8, the resulting substrate 18 may have a thickness in the direction from the first surface 20 towards the second surface 22 in the range of 10 µm to 200 µm. For example, the substrate 18 may have a thickness of approximately 90 µm.

After dividing the workpiece 2 in the manner detailed above, the second surface 22 of the substrate 18 may be ground and optionally polished. In the grinding step, and possibly the optional polishing step, the substrate 18 is adjusted to the final substrate thickness, e.g., 30 µm. The grinding step is performed by a grinding means (not shown) of the substrate producing system. The optional polishing step is performed by a polishing means (not shown) of the substrate producing system. Alternatively, the substrate producing system may comprise a combined grinding and polishing means (not shown).

Further, after dividing the workpiece 2, a surface of a remainder (not shown) of the workpiece 2, the surface being opposite the second surface 6 of the workpiece 2, may be ground and polished. This surface of the remainder of the workpiece 2 is a surface which has been exposed by dividing the workpiece 2 along the modified layer 8. By grinding and polishing the surface of the remainder of the workpiece 2, the remainder of the workpiece 2 can be efficiently prepared for obtaining a further substrate therefrom.

The grinding means or the combined grinding and polishing means further may be configured to grind the surface of the remainder of the workpiece 2 opposite the second surface 6 of the workpiece 2. Alternatively, the substrate producing system may comprise a further grinding means (not shown) or a further combined grinding and polishing means (not shown) for this purpose.

The polishing means or the combined grinding and polishing means further may be configured to polish the surface of the remainder of the workpiece 2 opposite the second surface 6 of the workpiece 2. Alternatively, the substrate producing system may comprise a further polishing means (not shown) or combined grinding and polishing means for this purpose.

After dividing the workpiece 2, the above-described steps of forming the modified layer 8, attaching the carrier 10 to the workpiece 2 and dividing the workpiece 2 may be repeated one or more times on the remainder of the workpiece 2, so as to obtain a plurality of, e.g., two or more, three or more, five or more, eight or more, ten or more, or twelve or more, substrates 18. In this way, plural substrates 18 can be obtained from a single workpiece 2 in an efficient and reliable manner. In particular, the method of the invention allows for the number of substrates 18 to be obtained from the workpiece 2 to be increased, as has been explained in detail above.

Figure 6:
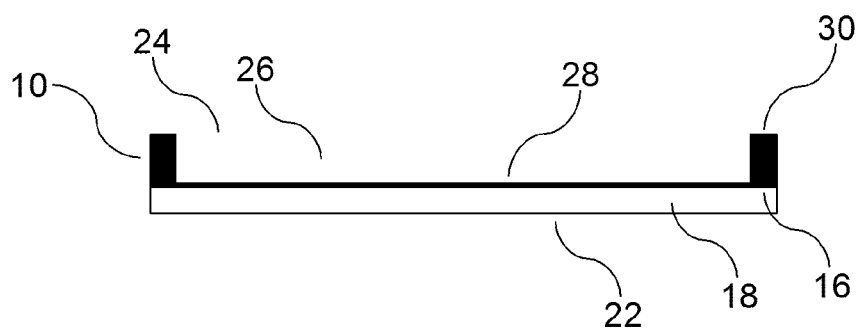
FIG. 6 is a cross-sectional view showing the outcome of a step of removing carrier material from the side of the second surface of the carrier in a central portion of the carrier according to the first embodiment of the method of the present invention.

Before or after grinding and optionally polishing the second surface 22 of the substrate 18, carrier material is removed from the side of the second surface 14 of the carrier 10 in a central portion 24 of the carrier 10. The outcome of this step is shown in FIG. 6. By removing the carrier material, a recess 26 is formed in the carrier 10. The recess 26 does not extend through the entire thickness of the carrier 10. A layer 28 of carrier material remains on the first surface 20 of the substrate 18. The layer 28 is a continuous layer of carrier material. The layer 28 is a thin layer, e.g., having a thickness in the range of 1 µm to 100 µm.

The recess 26 formed in the central portion 24 of the carrier 10 is surrounded by a peripheral portion 30 of the carrier 10. The peripheral portion 30 has a substantially annular shape with a ring width of 1 mm to 3 mm.

In the attachment step detailed above, only the peripheral portion 16 of the first surface 12 of the carrier 10 may be attached to the first surface 4 of the workpiece 2 (see, for example, FIG. 2). The peripheral portion 30 of the carrier 10, surrounding the recess 26, may be congruent with the peripheral portion 16 of the first surface 12 of the carrier 10. In this case, carrier material is removed in the entire area in which the carrier 10 and the workpiece 2 are not attached, i.e., unattached, to each other.

The step of removing carrier material described above may be performed, for example, by grinding the carrier 10 in the central portion 24 thereof. For this purpose, a grinding means (not shown) or a combined grinding and polishing means (not shown), e.g., the grinding means or the combined grinding and polishing means also used for grinding the second surface 22 of the substrate 18, may be employed. In this case, the grinding means or the combined grinding and polishing means forms part of a material removing means (not shown) of the substrate producing system.

Figure 7:
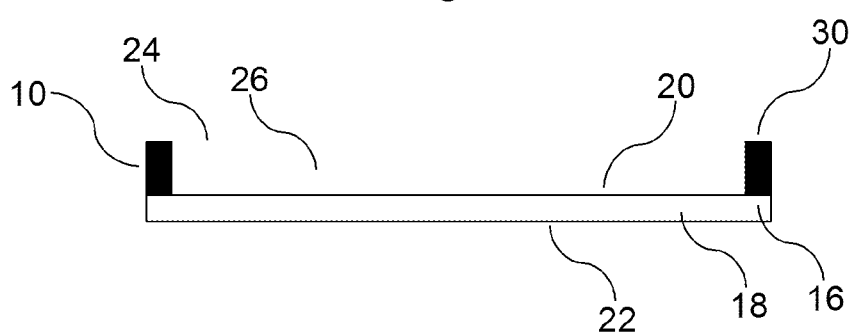
FIG. 7 is a cross-sectional view showing the outcome of a step of removing further carrier material from the side of the second surface of the carrier in the central portion of the carrier, so as to form a recess in the carrier extending through the entire thickness of the carrier and expose a portion of the first surface of the substrate, according to the first embodiment of the method of the present invention.
Figure 8:
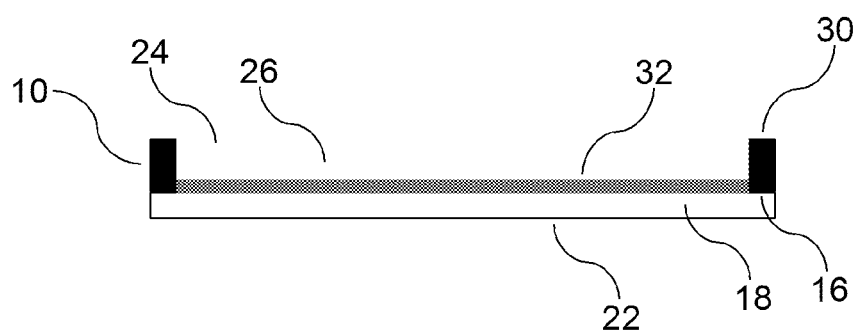
FIG. 8 is a cross-sectional view showing the outcome of a step of subjecting the exposed portion of the first surface of the substrate to a metallization process according to the first embodiment of the method of the present invention.

After forming the recess 26 in the carrier 10 in this manner, the carrier material layer 28 is removed, thereby extending the recess 26 so as to reach through the entire thickness of the carrier 10. In this way, a portion of the first surface 20 of the substrate 18 is exposed through the recess 26, as is shown in FIG. 7. In the method of the present embodiment, the first surface 20 of the substrate 18 is exposed in the entire area in which the recess 26 is formed in the carrier 10.

The layer 28 may be removed, for example, by etching, such as plasma etching and/or dry etching and/or wet etching, the carrier 10. For this purpose, the material removing means of the substrate producing system may further comprise an etching means (not shown). The etching means may consist of or comprise a plasma etching means and/or a dry etching means and/or a wet etching means.

In the method of the present embodiment, the carrier material removal process thus consists of two carrier material removal steps, e.g., a grinding step (see FIG. 6) and a subsequent etching step (see FIG. 7). In this way, it can be particularly reliably avoided that the substrate 18 may be damaged, e.g., in the process of grinding the carrier 10.

In other embodiments of the method of the present invention, a recess extending through the entire thickness of the carrier 10 may be formed in the carrier 10 in a single grinding and/or polishing step. In this grinding and/or polishing process, the exposed portion of the first surface 20 of the substrate 18 can be also, e.g., slightly, ground and/or polished. In this way, for example, the surface roughness of the exposed portion can be adjusted so as to enhance the adhesion of a metal layer 32 to be deposited on the exposed portion in a subsequent metallization process, such as the metallization process detailed in the following.

After extending the recess 26 through the entire thickness of the carrier 10 in the manner detailed above, the exposed portion of the first surface 20 of the substrate 18 is processed. Specifically, in the method of the present embodiment, the exposed portion of the first surface 20 is subjected to a metallization process. In this process, a metal layer 32 is formed on the exposed portion of the first surface 20 (see FIG. 8). During the metallization step, the substrate 18 is securely supported by the carrier 10.

The substrate producing system comprises a processing means (not shown) for processing the first surface 20 of the substrate 18. In the present embodiment, this processing means consists of or comprises a metallizing means (not shown) configured to perform the metallization process on the exposed portion of the first surface 20 of the substrate 18.

In other embodiments of the method of the present invention, additional or alternative steps of processing the exposed portion of the first surface 20 of the substrate 18 may be performed. Examples of such processing steps are lithography processes, the forming, e.g., drilling, of via holes or through holes, ablation laser processes and stealth laser processes, as has been detailed above.

Figure 9:
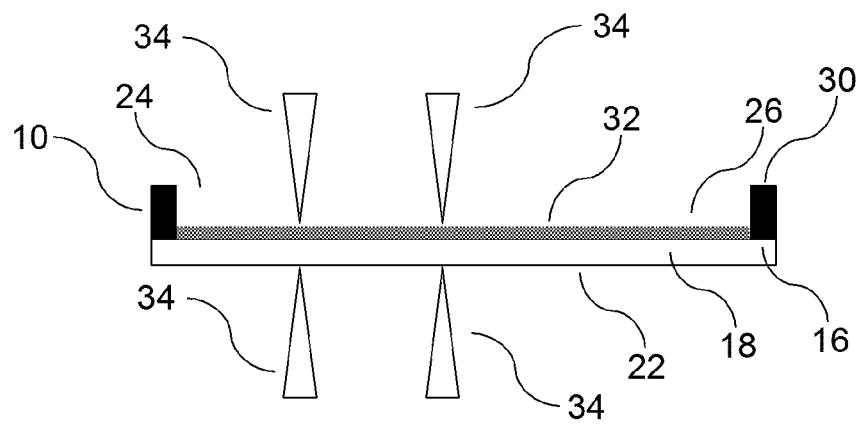
FIG. 9 is a cross-sectional view illustrating a step of performing an electrical testing process on the first and second surfaces of the substrate according to the first embodiment of the method of the present invention.

After forming the metal layer 32 on the exposed portion of the first surface 20, an electrical testing process is performed simultaneously on the metal layer 32 formed on the exposed portion of the first surface 20 and on the second surface 22 of the substrate 18. This testing process is carried out by using testing pins 34 of a testing means (not shown) of the substrate producing system, as is illustrated in FIG. 9. During the testing process, the substrate 18 is securely supported by the carrier 10. Hence, the testing process can be carried out in an especially reliable manner, in particular, since any deformation, such as warpage, of the substrate 18 can be reliably avoided.

Before or after performing the metallization process and/or the testing process, and after grinding and optionally polishing the second surface 22 of the substrate 18, a functional layer (not shown) may be formed on the second surface 22. The functional layer may be formed by a functional layer forming means (not shown) of the substrate producing system. During the process of forming the functional layer, the substrate 18 is securely supported by the carrier 10.

The functional layer may be as described above. In particular, the functional layer may be a device layer. The device layer may be formed only in a central portion of the second surface 22 of the substrate 18. In particular, in this central portion, a device area (not shown) comprising a plurality of devices may be formed. The device area may further have a plurality of division lines, partitioning the plurality of devices. A peripheral marginal area having no functional layer, in particular, no devices, may be formed around the central portion of the second surface 22 of the substrate 18. The peripheral marginal area of the second surface 22 may have a substantially annular shape with a ring width of 1 mm to 3 mm. The peripheral portion 30 of the carrier 10, surrounding the recess 26 formed in the central portion 24 of the carrier 10, may be congruent with the peripheral marginal area of the second surface 22.

The functional layer, in particular, the device layer, may be formed on the second surface 22 of the substrate 18 by epitaxial growth and/or patterning. In particular, an epitaxial layer may be formed on the second substrate surface 22 by epitaxial growth. Subsequently, the epitaxial layer may be subjected to a patterning process, e.g., by lithography, so as to obtain the functional layer, in particular, the device layer. For this purpose, the functional layer forming means of the substrate producing system may comprise or consist of an epitaxial growing means (not shown) and/or a patterning means (not shown).

The carrier 10 may be removed from the substrate 18, e.g., after processing and/or testing of the substrate 18 has been finished or completed.

In the following, a second embodiment of the present invention will be described with reference to FIG. 10.

The method of the second embodiment differs from the method of the first embodiment only in the step of extending the recess 26 so as to reach through the entire thickness of the carrier 10.

In particular, in the method of the second embodiment, the steps of forming the modified layer 8 inside the workpiece 2, attaching the carrier 10 to the workpiece 2, dividing the workpiece 2 along the modified layer 8 and forming the recess 26 in the carrier 10 which does not extend through the entire thickness of the carrier 10 are the same as those described above for the method of the first embodiment or for the method of the modification of the first embodiment. In the method of the second embodiment, only the peripheral portion 16 of the first surface 12 of the carrier 10 is attached to the first surface 4 of the workpiece 2 (see, for example, FIG. 2). The peripheral portion 30 of the carrier 10, surrounding the recess 26, is congruent with the peripheral portion 16 of the first surface 12 of the carrier 10.

Figure 10:
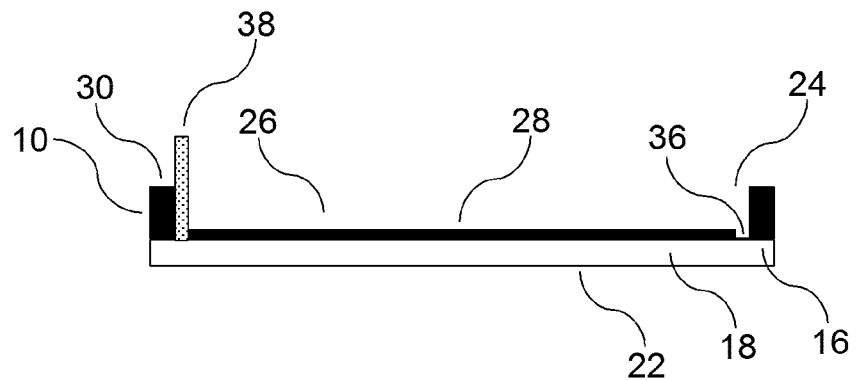
FIG. 10 is a cross-sectional view illustrating a step of removing further carrier material from the side of the second surface of the carrier in the central portion of the carrier, so as to form a recess in the carrier extending through the entire thickness of the carrier and expose a portion of the first surface of the substrate, according to a second embodiment of the method of the present invention.

After forming the recess 26 not extending through the entire thickness of the carrier 10 in the manner described above for the method of the first embodiment (see FIG. 6), the carrier material layer 28 is removed by cutting the layer 28 along the inside of the peripheral portion 30 of the carrier 10, thereby forming a substantially annular recess 36 fully extending through the layer 28 (see FIG. 10). Since the carrier 10 is attached to the workpiece 2 only in the peripheral portion 16 of the first surface 12 of the carrier 10, the layer 28, which is unattached to the workpiece 2, can be particularly easily removed after the above cutting process. By removing the layer 28, the recess 26 is extended so as to reach through the entire thickness of the carrier 10 and the portion of the first surface 20 of the substrate 18 is exposed (see FIG. 7).

In the method of the second embodiment, the layer 28 is cut along the inside of the peripheral portion 30 in a substantially annular manner by using a cutting blade 38, as is illustrated in FIG. 10. The cutting blade 38 forms part of a mechanical cutting means (not shown) of the substrate producing system. Alternatively or in addition, the layer 28 may be cut by laser cutting and/or by plasma cutting. For this purpose, the substrate producing system may comprise a laser cutting means (not shown) and/or a plasma cutting means (not shown). The laser cutting means may be configured to perform laser ablation.

In the method of the second embodiment, the carrier material removal process thus consists of two carrier material removal steps, e.g., a grinding step (see FIG. 6) and a subsequent cutting step (see FIG. 10). In this way, it can be particularly reliably avoided that the substrate 18 may be damaged, e.g., in the process of grinding the carrier 10.

After extending the recess 26 through the entire thickness of the carrier 10 in the manner detailed above, thereby exposing the portion of the first surface 20 of the substrate 18, the further steps detailed above for the method of the first embodiment are carried out.

In the following, a third embodiment of the present invention will be described with reference to FIG. 11.

The method of the third embodiment differs from the method of the second embodiment substantially only in that the step of forming a recess in the carrier 10 which does not extend through the entire thickness of the carrier 10 as described above with reference to FIG. 6 is omitted.

In particular, in the method of the third embodiment, the steps of forming the modified layer 8 inside the workpiece 2, attaching the carrier 10 to the workpiece 2 and dividing the workpiece 2 along the modified layer 8 are the same as those described above for the method of the first embodiment or for the method of the modification of the first embodiment. In the method of the third embodiment, only the peripheral portion 16 of the first surface 12 of the carrier 10 is attached to the first surface 4 of the workpiece 2 (see, for example, FIG. 2).

Figure 11:
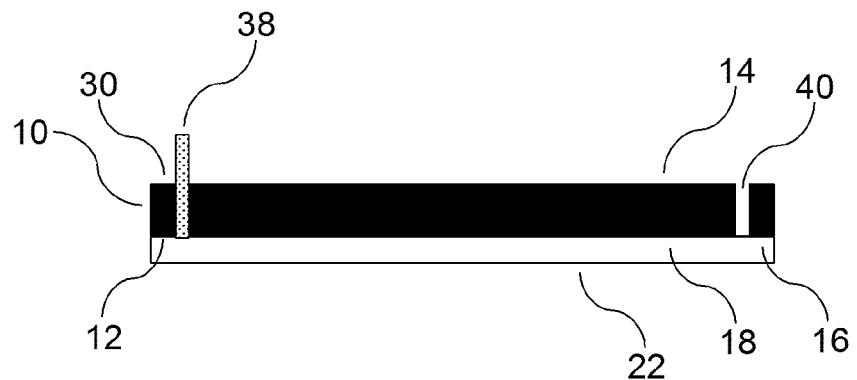
FIG. 11 is a cross-sectional view illustrating a step of removing carrier material from the side of the second surface of the carrier in the central portion of the carrier, so as to form a recess in the carrier extending through the entire thickness of the carrier and expose a portion of the first surface of the substrate, according to a third embodiment of the method of the present invention.

After dividing the workpiece 2 along the modified layer 8 in the manner described above for the method of the first embodiment (see FIG. 5), the carrier 10 is cut along the inside of the peripheral portion 30 of the carrier 10, thereby forming a substantially annular recess 40 fully extending through the thickness of the carrier 10 (see FIG. 11). The peripheral portion 30 of the carrier 10 is congruent with the peripheral portion 16 of the first surface 12 of the carrier 10. Since the carrier 10 is attached to the workpiece 2 only in the peripheral portion 16 of the first surface 12 of the carrier 10, the central portion of the carrier 10, which is surrounded by the peripheral portion 30 of the carrier 10 and is unattached to the workpiece 2, can be particularly easily removed after the above cutting process. By removing this central portion of the carrier 10, the recess 26 extending through the entire thickness of the carrier 10 is formed and the portion of the first surface 20 of the substrate 18 is exposed (see FIG. 7). The recess 26 is surrounded by the peripheral portion 30 of the carrier 10.

In the method of the third embodiment, the carrier 10 is cut along the inside of the peripheral portion 30 in a substantially annular manner by using a cutting blade, in particular, the cutting blade 38 also employed for the method of the second embodiment, as is illustrated in FIG. 11. The cutting blade 38 forms part of a mechanical cutting means (not shown) of the substrate producing system. Alternatively or in addition, the carrier 10 may be cut by laser cutting and/or by plasma cutting. For this purpose, the substrate producing system may comprise a laser cutting means (not shown) and/or a plasma cutting means (not shown). The laser cutting means may be configured to perform laser ablation.

In the method of the third embodiment, the carrier material removal process thus consists of a single carrier material removal step, i.e., a cutting step (see FIG. 11). In this way, the carrier material removal process can be further simplified.

After forming the recess 26 extending through the entire thickness of the carrier 10 in the manner detailed above, thereby exposing the portion of the first surface 20 of the substrate 18, the further steps detailed above for the method of the first embodiment are carried out.

Figure 13:
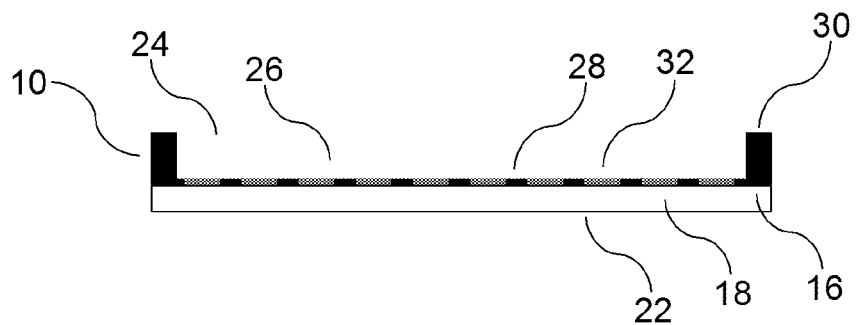
FIG. 13 is a cross-sectional view showing the outcome of a step of subjecting the exposed portion of the first surface of the substrate to a metallization process according to the fourth embodiment of the method of the present invention.
Figure 14:
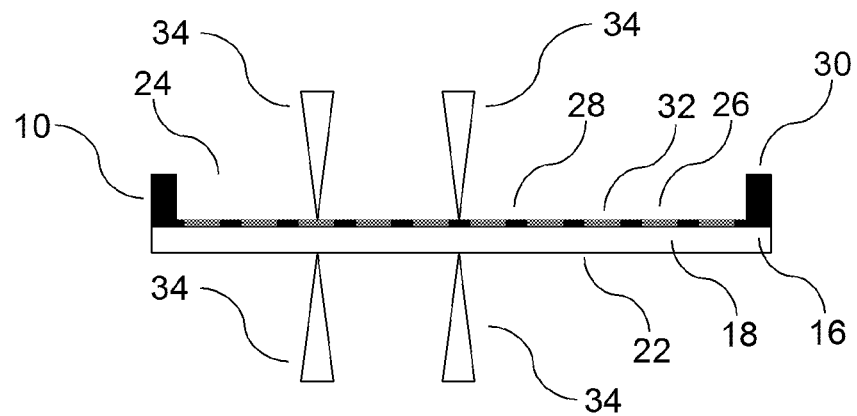
FIG. 14 is a cross-sectional view illustrating a step of performing an electrical testing process on the first and second surfaces of the substrate according to the fourth embodiment of the method of the present invention.

In the following, a fourth embodiment of the present invention will be described with reference to FIGS. 12 to 14.

The method of the fourth embodiment differs from the method of the first embodiment substantially only in that the first surface 20 of the substrate 18 is exposed only in a part of the area in which the recess 26 is formed in the carrier 10.

In particular, in the method of the fourth embodiment, the steps of forming the modified layer 8 inside the workpiece 2, attaching the carrier 10 to the workpiece 2, dividing the workpiece 2 along the modified layer 8 and forming the recess 26 in the carrier 10 which does not extend through the entire thickness of the carrier 10 are the same as those described above for the method of the first embodiment or for the method of the modification of the first embodiment. Preferably, in the method of the fourth embodiment, the entire first surface 12 of the carrier 10 is attached to the first surface 4 of the workpiece 2.

Figure 12:
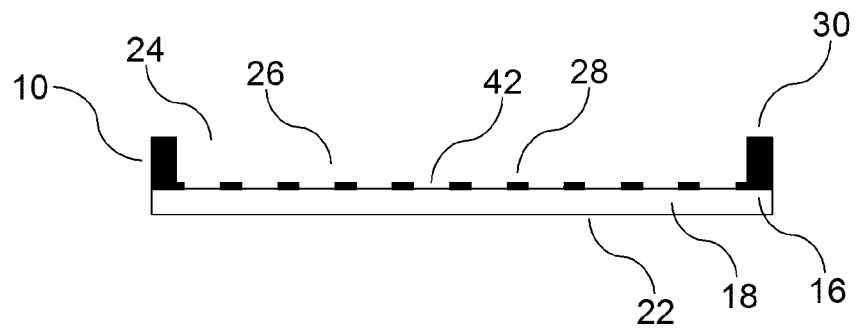
FIG. 12 is a cross-sectional view showing the outcome of a step of removing further carrier material from the side of the second surface of the carrier in the central portion of the carrier, so as to expose a portion of the first surface of the substrate, according to a fourth embodiment of the method of the present invention.

After forming the recess 26 not extending through the entire thickness of the carrier 10 in the manner described above for the method of the first embodiment (see FIG. 6), the carrier material layer 28 is partially removed so as to form a plurality of openings 42 in the layer 28 (see FIG. 12). The openings 42 extend through the entire thickness of the layer 28. Thus, the first surface 20 of the substrate 18 is exposed through these openings 42. The carrier material layer 28 may be maintained, e.g., in a grid arrangement, in areas of the substrate 18 along which the substrate 18 is to be subsequently divided, e.g., cut, as will be further detailed below.

The openings 42 may be formed in the layer 28, for example, by lithography, such as optical lithography or electron beam lithography, and/or by etching. For this purpose, the material removing means of the substrate producing system may comprise a lithography means (not shown) and/or an etching means (not shown).

In the method of the fourth embodiment, the carrier material removal process thus consists of two carrier material removal steps, e.g., a grinding step (see FIG. 6) and a subsequent lithography step (see FIG. 12).

After forming the plurality of openings 42 in the layer 28, the portions of the first surface 20 of the substrate 18 exposed through the openings 42 are subjected to a metallization process. In this process, the metal layer 32 is formed on the exposed portions of the first surface 20 (see FIG. 13). During the metallization step, the substrate 18 is securely supported by the carrier 10.

In other embodiments of the method of the present invention, additional or alternative steps of processing the exposed portions of the first surface 20 of the substrate 18 may be performed. Examples of such processing steps are lithography processes, the forming, e.g., drilling, of via holes or through holes, ablation laser processes and stealth laser processes, as has been detailed above.

After forming the metal layer 32 on the exposed portions of the first surface 20, an electrical testing process is performed simultaneously on the metal layer 32 formed on the exposed portions of the first surface 20 and on the second surface 22 of the substrate 18. This testing process is carried out by using testing pins 34 of a testing means (not shown) of the substrate producing system, as is illustrated in FIG. 14. During the testing process, the substrate 18 is securely supported by the carrier 10. Hence, the testing process can be carried out in an especially reliable manner, in particular, since any deformation, such as warpage, of the substrate 18 can be reliably avoided.

Moreover, the further steps detailed above for the method of the first embodiment may be carried out. In particular, before or after performing the metallization process and/or the testing process described above, and after grinding and optionally polishing the second surface 22 of the substrate 18, a functional layer (not shown) may be formed on the second surface 22. During the process of forming the functional layer, the substrate 18 is securely supported by the carrier 10.

The functional layer may be as described above. In particular, the functional layer may be a device layer. The device layer may be formed only in a central portion of the second surface 22 of the substrate 18. In particular, in this central portion, a device area (not shown) comprising a plurality of devices may be formed. The device area may further have a plurality of division lines, partitioning the plurality of devices. A peripheral marginal area having no functional layer, in particular, no devices, may be formed around the central portion of the second surface 22 of the substrate 18.

The division lines, partitioning the plurality of devices, may correspond to, e.g., be substantially congruent with, the areas of the first substrate surface 20 in which the carrier material layer 28 has been maintained (see, for example, FIG. 12).

The substrate 18 is divided, e.g., cut, along the division lines so as to obtain a plurality of chips or dies having the devices provided thereon. For example, the substrate 18 may be divided by blade cutting and/or laser cutting and/or plasma cutting. Since, in the regions of the division lines, no metal layer 32 is present on the first surface 20 of the substrate 18 (see FIG. 13), the process of dividing the substrate 18 can be considerably facilitated. In particular, in this process, it is not necessary to cut through the metal layer 32.

The invention claimed is:

1. A method of producing a substrate, the method comprising:
   providing a workpiece having a first surface and a second surface opposite the first surface;
   providing a carrier having a first surface and a second surface opposite the first surface;
   attaching the carrier to the workpiece, wherein at least a peripheral portion of the first surface of the carrier is attached to the first surface of the workpiece so that the first surface of the carrier is in direct contact with the first surface of the workpiece such that no adhesive is present between the first surface of the carrier and the first surface of the workpiece;
   forming a modified layer inside the workpiece;
   dividing the workpiece along the modified layer, thereby obtaining the substrate, wherein the substrate has the carrier attached thereto; and
   removing carrier material from the side of the second surface of the carrier in a central portion of the carrier so as to form a recess in the carrier.

2. The method according to claim 1, wherein the entire first surface of the carrier is attached to the first surface of the workpiece.

3. The method according to claim 1, wherein the at least a peripheral portion of the first surface of the carrier is attached to the first surface of the workpiece by fusion bonding and/or anodic bonding.

4. The method according to claim 1, wherein only the peripheral portion of the first surface of the carrier is attached to the first surface of the workpiece.

5. The method according to claim 1, wherein a portion of a surface of the substrate, on a side of the substrate at which the carrier is attached, is exposed in the step of removing carrier material.

6. The method according to claim 5, wherein the method further comprises processing the exposed portion of the surface of the substrate.

7. The method according to claim 1, wherein removing carrier material from the side of the second surface of the carrier in the central portion of the carrier comprises grinding the carrier and/or polishing the carrier and/or cutting the carrier and/or etching the carrier.

8. The method according to claim 7, wherein etching the carrier comprises or consists of plasma etching the carrier and/or dry etching the carrier and/or wet etching the carrier.

9. The method according to claim 7, wherein cutting the carrier comprises or consists of blade cutting the carrier and/or laser cutting the carrier and/or plasma cutting the carrier.

10. The method according to claim 1, wherein forming the modified layer inside the workpiece comprises or consists of applying a laser beam to the workpiece.

11. The method according to claim 10, wherein the workpiece is made of a material which is transparent to the laser beam.

* * * * *